(12) United States Patent
Kang et al.

(10) Patent No.: US 8,133,641 B2
(45) Date of Patent: Mar. 13, 2012

(54) HALF TONE MASK HAVING MULTI-HALF PERMEATION PART AND A METHOD OF MANUFACTURING THE SAME

(75) Inventors: Kap-Seok Kang, Gyeongsangbuk-do (KR); Jae-Woo Park, Gyeongsangbuk-do (KR); Sang-Uk Park, Gyeongsangbuk-do (KR); Yu-Kyung Sim, Gyeongsangbuk-do (KR); Keun-Sik Lee, Incheon (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/296,563

(22) PCT Filed: May 11, 2007

(86) PCT No.: PCT/KR2007/002341
§ 371 (c)(1),
(2), (4) Date: Oct. 9, 2008

(87) PCT Pub. No.: WO2008/140136
PCT Pub. Date: Nov. 20, 2008

(65) Prior Publication Data
US 2010/0159367 A1 Jun. 24, 2010

(51) Int. Cl.
*G03F 1/00* (2012.01)
(52) U.S. Cl. .......................................................... 430/5
(58) Field of Classification Search .............. 430/5, 394; 716/19, 20, 21
See application file for complete search history.

(56) References Cited

U.S. PATENT DOCUMENTS

| 7,157,319 B2 * | 1/2007 | Ishikawa et al. ............. 438/158 |
| 2006/0099521 A1 * | 5/2006 | Park et al. ..................... 430/5 |
| 2006/0269849 A1 | 11/2006 | Lee |
| 2008/0026299 A1 * | 1/2008 | Chai et al. ..................... 430/5 |

FOREIGN PATENT DOCUMENTS

| CN | 1673829 A | 9/2005 |
| CN | 1726424 A | 1/2006 |
| JP | 2000-181048 A | 6/2000 |
| JP | 2002-151381 A | 5/2002 |
| JP | 2002-151523 A | 5/2002 |
| JP | 2002-525652 A | 8/2002 |

(Continued)

OTHER PUBLICATIONS

International Search Report (ISR) dated Oct. 10, 2007, for International Application PCT/KR2007/002341.

(Continued)

*Primary Examiner* — Stephen Rosasco
(74) *Attorney, Agent, or Firm* — LRK Patent Law Firm

(57) ABSTRACT

Disclosed are a half tone mask having a multi semi-transmission part and a manufacturing method thereof that can pattern a plurality of layers using one mask, by having at least two or more semi-transmission parts with light transmission that are different from each other. The half tone mask having a multi semi-transmission part comprises a transparent substrate, a light transmission part formed the transparent substrate to transmit irradiation light of a predetermined wavelength band, a light shielding part formed the transparent substrate to shield the irradiation light of the predetermined wavelength band, and at least two or more semi-transmission parts formed by depositing semi-transmission material on the transparent substrate to pass through the irradiation light of the predetermined wavelength band with each different light transmission.

18 Claims, 26 Drawing Sheets

FOREIGN PATENT DOCUMENTS

| | | |
|---|---|---|
| JP | 2002-365782 A | 12/2002 |
| JP | 2002-365784 A | 12/2002 |
| JP | 2004-213049 A | 7/2004 |
| JP | 2005-010467 A | 1/2005 |
| JP | 2005-037933 A | 2/2005 |
| JP | 2006-011121 A | 1/2006 |
| JP | 2006-133785 A | 5/2006 |
| JP | 2006-184356 A | 7/2006 |
| JP | 2006-227365 A | 8/2006 |
| JP | 2006-259293 A | 9/2006 |
| JP | 2006-268035 A | 10/2006 |
| JP | 2007-072452 A | 3/2007 |
| KR | 10-0144942 B1 | 4/1998 |
| KR | 10-2001-0002127 A | 1/2001 |
| KR | 10-2002-0057215 A | 7/2002 |
| KR | 10-2003-0031924 A | 4/2003 |
| KR | 10-2003-0031927 A | 4/2003 |
| KR | 10-2003-0036261 A | 5/2003 |
| KR | 10-2004-0101171 A | 12/2004 |
| KR | 10-2006-0073037 A | 6/2006 |
| WO | 2007/010866 A1 | 1/2007 |

OTHER PUBLICATIONS

Written Opinion (WO) of the International Search Authority dated Oct. 10, 2007, for International Application PCT/KR2007/002341.

SIPO Office Action for Chinese Patent Application No. 200780016462.0 which corresponds to U.S. Appl. No. 12/296,563.

JPO Office Action for Japanese Patent Application No. 2010-507305 which corresponds to the above-identified U.S. Appl. No. 12/296,563.

\* cited by examiner

HALF TONE MASK HAVING MULTI-HALF PERMEATION PART AND A METHOD OF MANUFACTURING THE SAME

TECHNICAL FIELD

The present invention relates to a half tone mask having a transmission part, a semi-transmission part and a light-shielding part, and a manufacturing method thereof. More particularly, the present invention relates to a half tone mask having a multi semi-transmission part and a manufacturing method thereof that can pattern a plurality of layers using one mask, by having at least two or more semi-transmission parts with light transmission that are different from each other.

BACKGROUND ART

A photomask, which is usually used during the patterning in a photolithography process, includes a transparent substrate 11, a light transmission part 13 formed on the transparent substrate 11 for transmitting completely light, and a light shielding part 15 for shielding completely the light, as shown in FIG. 1.

The above-described photomask could be used only during the photolithography process of one cycle that is progressed in order of an exposure process, a development process and an etching process, because it can be used to form a pattern of only one layer. More particularly, a thin film transistor (TFT) and a color filter (CF) of a liquid crystal display (LCD) are deposited and coated as many layers. Each of the deposited and coated layers is patterned by the photolithography process. If the photolithography process of one cycle can be reduced, many economical effects can be obtained. However, as described above, the conventional photomask can form the pattern of only one layer, thereby being non-economical.

DISCLOSURE

Technical Problem

Accordingly, an object of the present invention is to provide a half tone mask having a multi semi-transmission part and a manufacturing method thereof that can pattern a plurality of layers using one mask, by having at least two or more semi-transmission parts with light transmission that are different from each other.

Technical Solution

According to an aspect of the present invention, there is provided a half tone mask having a multi semi-transmission part, which includes: a transparent substrate; a light transmission part formed on the transparent substrate to transmit irradiation light of a predetermined wavelength band; a light shielding part formed on the transparent substrate to shield the irradiation light of the predetermined wavelength band; and at least two or more semi-transmission parts formed by depositing semi-transmission material on the transparent substrate to pass through the irradiation light of the predetermined wavelength band with each different light transmission.

The light transmission of at least two or more semi-transmission part may be controlled according to the composition of the semi-transmission material or thickness of the semi-transmission part.

The semi-transmission material may include Cr, Si, Mo, Ta, Ti, and Al as a major element, and be complex material to which at least two or more of the major elements are mixed, or additive material to which at least one of COx, Ox, and Nx is added to the complex material.

The light shielding part may be formed by depositing the light-shielding material film, or by depositing sequentially a semi-transmission material film and a light-shielding material film.

According to another aspect of the present invention, there is provided a manufacturing method of a half tone mask having a multi semi-transmission part, which includes: forming sequentially a light shielding layer and a first photoresist on a transparent substrate and forming a light transmission part for transmitting light and a light shielding part for shielding the light on the light shielding layer by using an exposure process, a development process and an etching process sequentially; depositing semi-transmission materials for transmitting a part of the light with a predetermined wavelength band irradiated on the light shielding part and the light transmission part after removing the first photoresist; forming a second photoresist on the semi-transmission material and exposing and developing the second photoresist to expose a part of the semi-transmission material; forming a basic semi-transmission part by removing the second photoresist after etching the exposed semi-transmission material; and depositing the semi-transmission materials on the light transmission part on which the basic semi-transmission part is not formed and forming at least one additional semi-transmission parts with light transmission different from the basic semi-transmission part.

According to still another aspect of the present invention, there is provided a manufacturing method of a half tone mask having a multi semi-transmission part, which includes: forming sequentially a light shielding layer and a first photoresist on a transparent substrate and forming a light transmission part for transmitting light and a light shielding part for shielding the light on the light shielding layer by using an exposure process, a development process and an etching process sequentially; removing the first photoresist and forming a second photoresist on the light transmission part and the light shielding part, and exposing and developing the second photoresist to expose a part of the light transmission part, where the semi-transmission part is formed, to the outside; depositing the semi-transmission material on an upper part of the light transmission part exposed to the outside and an upper part of the second photoresist; forming a basic semi-transmission part by removing the second photoresist and the semi-transmission material deposited on the upper part of the second photoresist by using a lift-off method and remaining the semi-transmission material only on the upper part of the light transmission part exposed to the outside; and depositing the semi-transmission materials on the light transmission part on which the basic semi-transmission part is not formed and forming at least one additional semi-transmission parts with light transmission different from the basic semi-transmission part.

Forming the additional semi-transmission part may include: forming a third photoresist on the basic semi-transmission part, the light transmission part and the light shielding part; exposing and developing the third photoresist to expose a part of the light transmission part, where the semi-transmission part is formed, to the outside; depositing the semi-transmission material on the upper part of the light transmission part exposed to the outside and the upper part of the third photoresist; removing the third photoresist and the semi-transmission material deposited on the upper part of the third photoresist by using the lift-off method and remaining the semi-transmission material only on the upper part of the light transmission part exposed to the outside.

Forming the additional semi-transmission part may be repeated to form additionally the additional semi-transmission part.

According to yet still another aspect of the present invention, there is provided a manufacturing method of a half tone mask having a multi semi-transmission part, which includes: forming a full exposure region and a half exposure region by forming sequentially a semi-transmission material film, a light shielding material film, and a first photoresist, on a transparent substrate, performing a full exposure process and a half exposure process on the first photoresist and developing the exposed part of the first photoresist; etching sequentially the light shielding material film and the semi-transmission material film, that are respectively exposed on the full exposure region, so as to form a light transmission part; performing an ashing process on the first photoresist to expose the light shielding material film located on the half exposure region to the outside; forming a basic semi-transmission part by etching partially the light shielding material film exposed to the outside to expose the semi-transmission material film to the outside and forming a light shielding part by removing the first photoresist; and forming at least one additional semi-transmission parts with light transmission different from the basic semi-transmission part by depositing the semi-transmission material on the light transmission part.

Forming the additional semi-transmission part may include: forming a second photoresist on the basic semi-transmission part, the light transmission part and the light shielding part; exposing and developing the second photoresist to expose a part of the light transmission part, where the semi-transmission part is formed, to the outside; depositing the semi-transmission material on the upper part of the light transmission part exposed to the outside and the upper part of the second photoresist; removing the second photoresist and the semi-transmission material deposited on the upper part of the second photoresist by using the lift-off method and remaining the semi-transmission material only on the upper part of the light transmission part exposed to the outside.

Forming the additional semi-transmission part may be repeated to form additionally the additional semi-transmission part.

According to yet still another aspect of the present invention, there is provided a half tone mask having a multi semi-transmission part, which includes: a transparent substrate; a light transmission part formed on the transparent substrate to transmit irradiation light of a predetermined wavelength band; a light shielding part formed on the transparent substrate to shield the irradiation light of the predetermined wavelength band; and at least two or more semi-transmission parts passing through the light of the predetermined wavelength irradiated on the transparent substrate with each different light transmission, wherein the semi-transmission part comprises a slit type semi-transmission part, a deposition type semi-transmission part or combination thereof.

The deposition type semi-transmission part may be formed by depositing the semi-transmission material film.

The slit type semi-transmission part may be formed on a predetermined part of the light shielding part.

The slit type semi-transmission part may be formed on predetermined part of the deposition type semi-transmission part.

The light transmission of the deposition type semi-transmission part may be changed according to the composition or thickness of the semi-transmission material film.

The semi-transmission material may include Cr, Si, Mo, Ta, Ti, Al as major elements, and be mixed complex of at least two or more of major elements consisting of Cr, Si, Mo, Ta, Ti, Al or an additive of at least one elements selected from Cox, Ox and Nx.

The light transmission of the slit type semi-transmission part may be changed according to width and height of the slit.

According to yet still another aspect of the present invention, there is provided a manufacturing method of a half tone mask having a multi semi-transmission part, which includes: forming sequentially a light shielding material film, and a first photoresist, on a transparent substrate, and then forming at least one slit space part on the first photoresist using an exposure process and a development process; etching the exposed light shielding material film using the development process and removing the first photoresist so as to form a light shielding part, a light transmission part and a slit type semi-transmission part; and depositing the semi-transmission material on the light transmission part to form at least one deposition type semi-transmission parts having light transmission different from the slit type semi-transmission part.

According to yet still another aspect of the present invention, there is provided a manufacturing method of a half tone mask having a multi semi-transmission part, which includes: forming sequentially a light shielding material film and a first photoresist on a transparent substrate and forming a light transmission part for transmitting light and a light shielding part for shielding the light on the light shielding layer by using an exposure process, a development process and an etching process sequentially; depositing semi-transmission materials for transmitting a part of the light with a predetermined wavelength band on the light transmission part to form at least one deposition type semi-transmission part; forming a slit type semi-transmission part having light transmission different from the deposition type semi-transmission on at least one of the deposition type semi-transmission part and the light shielding part.

DESCRIPTION OF DRAWINGS

The above and other objects, features and advantages of the present invention will be more apparent from the following detailed description taken in conjunction with the accompanying drawing, in which.

MODE FOR INVENTION

Hereinafter, a half tone mask having the multi semi-transmission part and a manufacturing method thereof according to the present invention will be described in detail with reference to the accompanying drawing.

Figure 1:
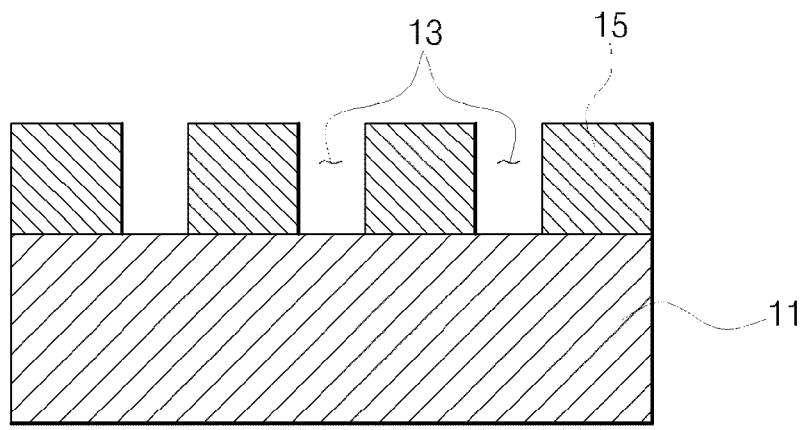
FIG. 1 is a schematic diagram illustrating a conventional photomask.
Figure 2:
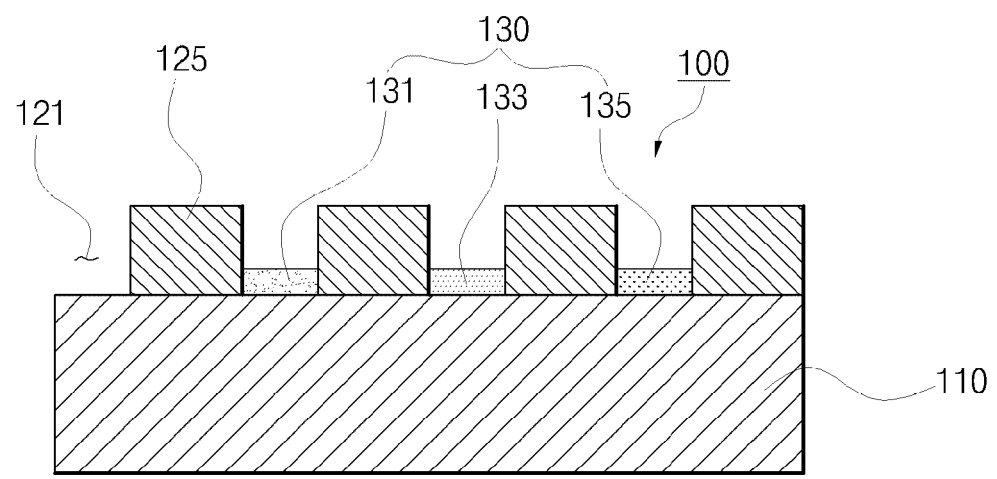
FIG. 2 is a schematic diagram illustrating a half tone mask having a multi semi-transmission part according to one exemplary embodiment of the present invention.
Figure 3:
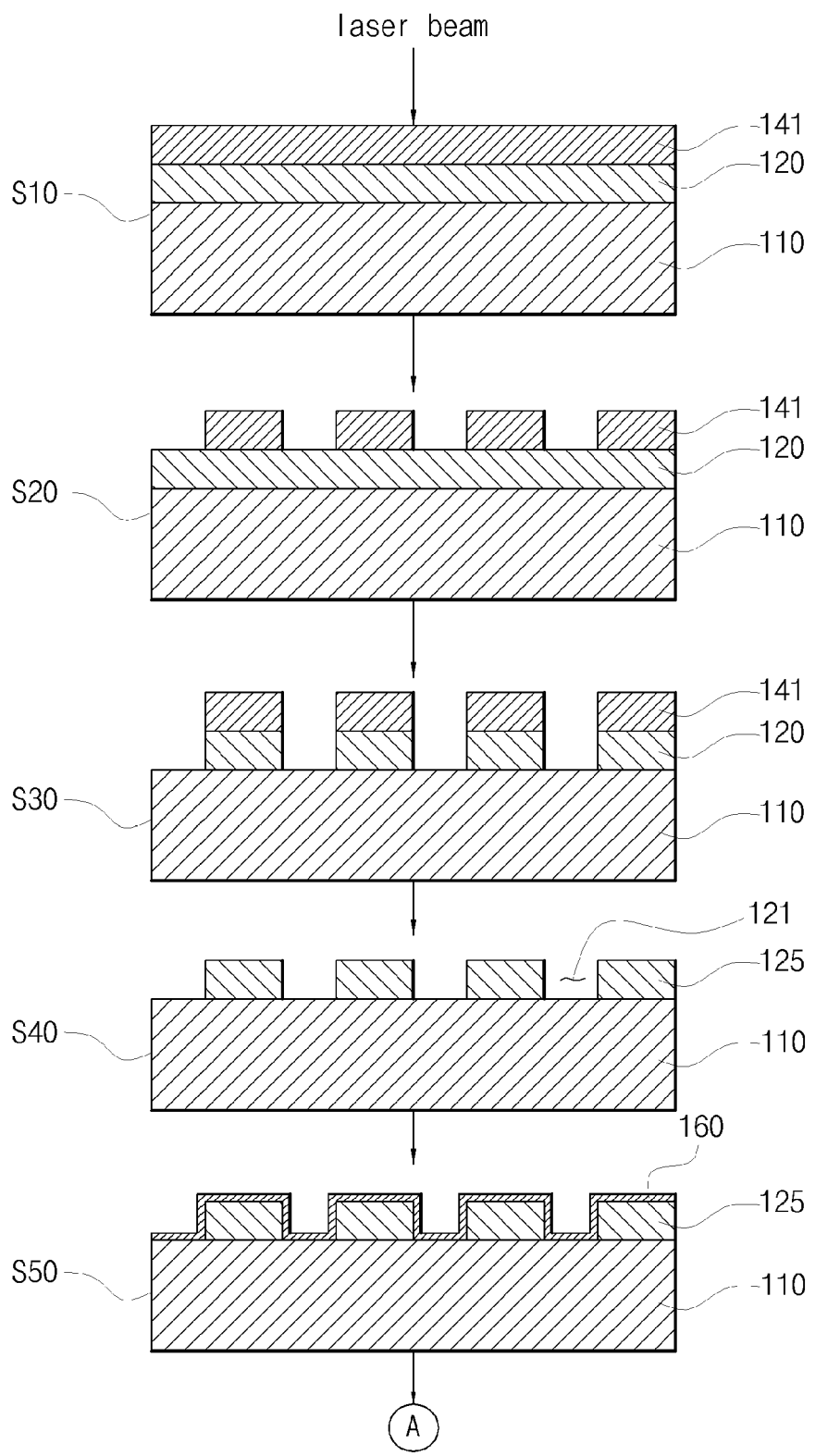
FIGS. 3 to 6 are respectively flow charts illustrating a first process of manufacturing the half tone mask having the multi semi-transmission part according to one exemplary embodiment of the present invention.
Figure 4:
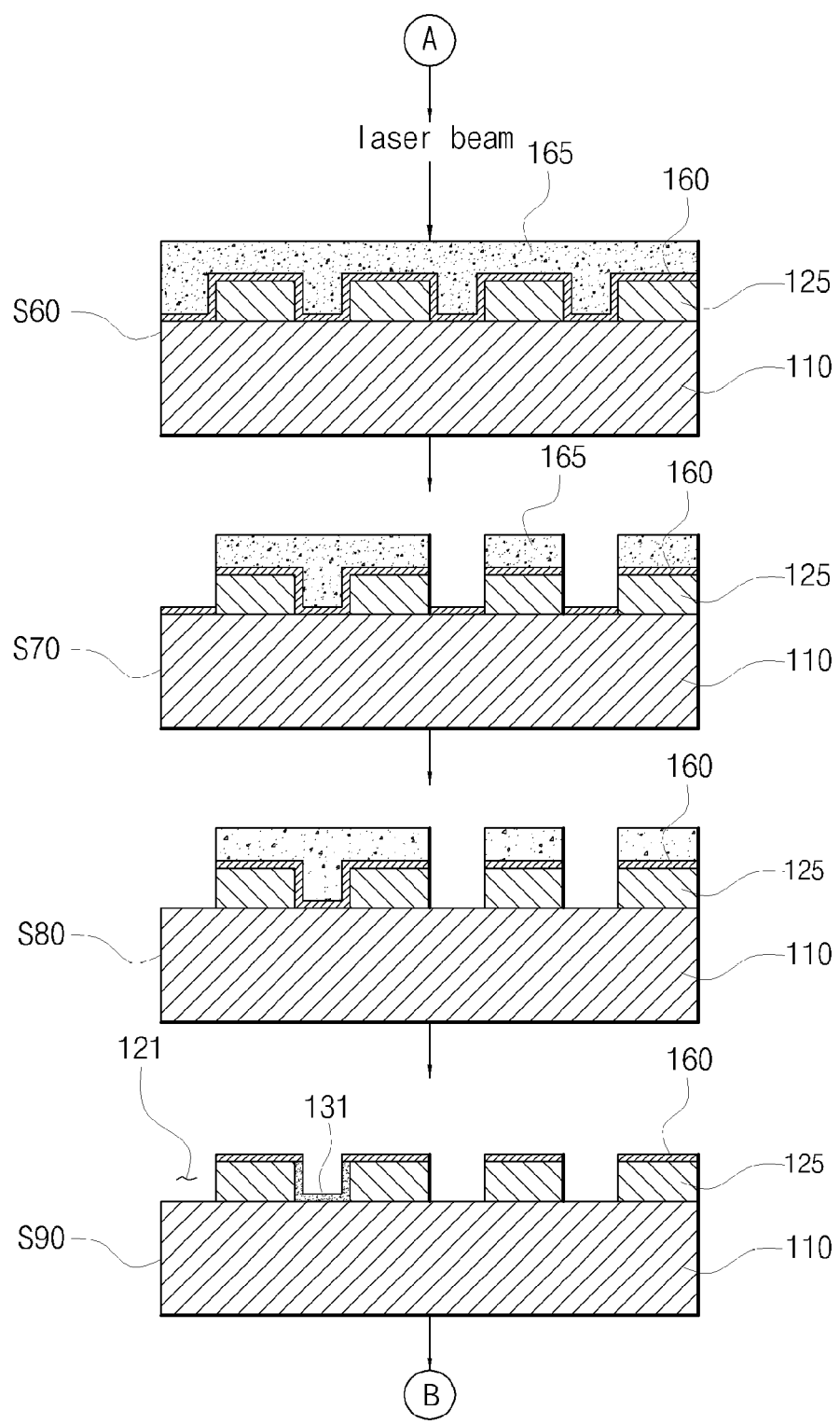
Figure 5:
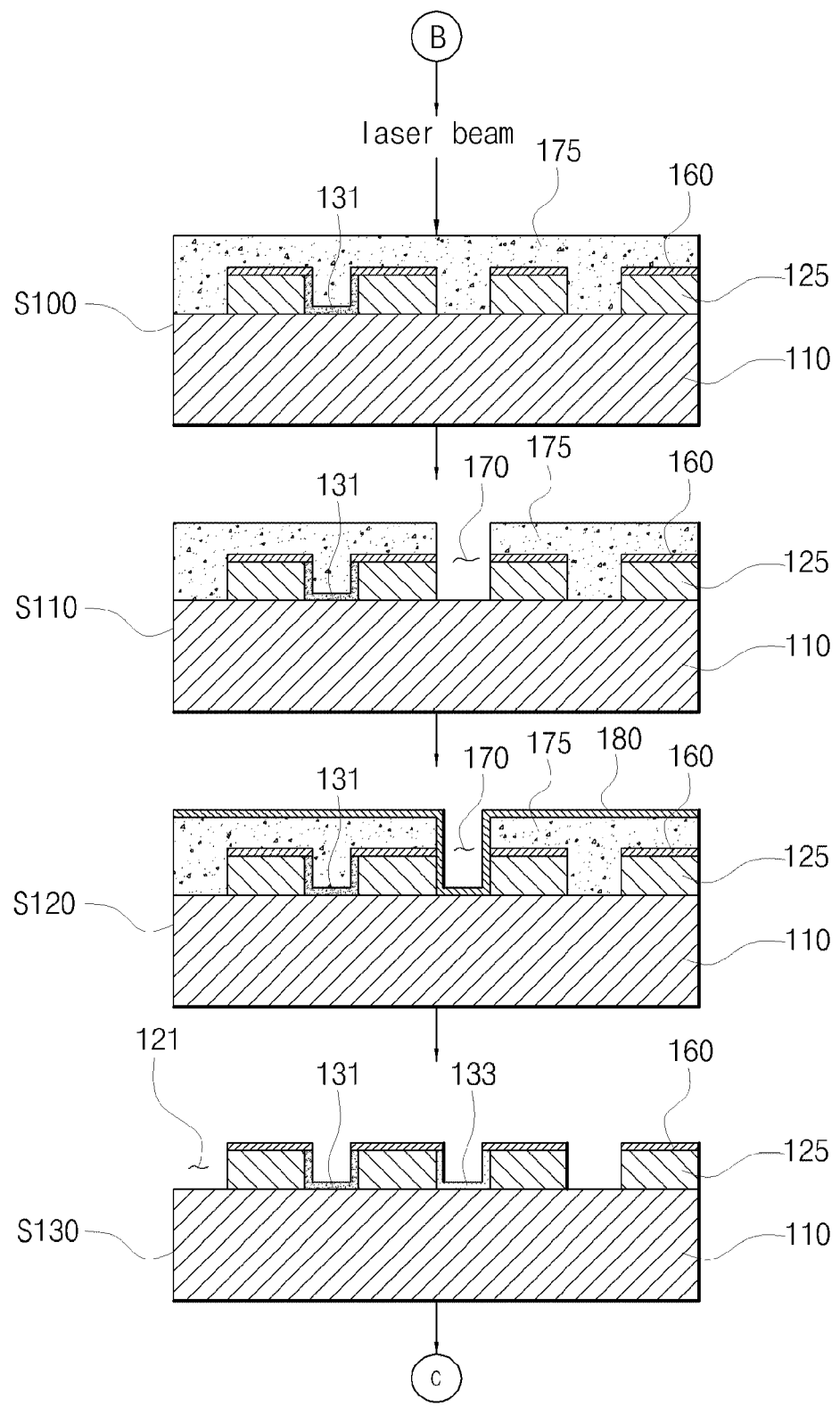
Figure 6:
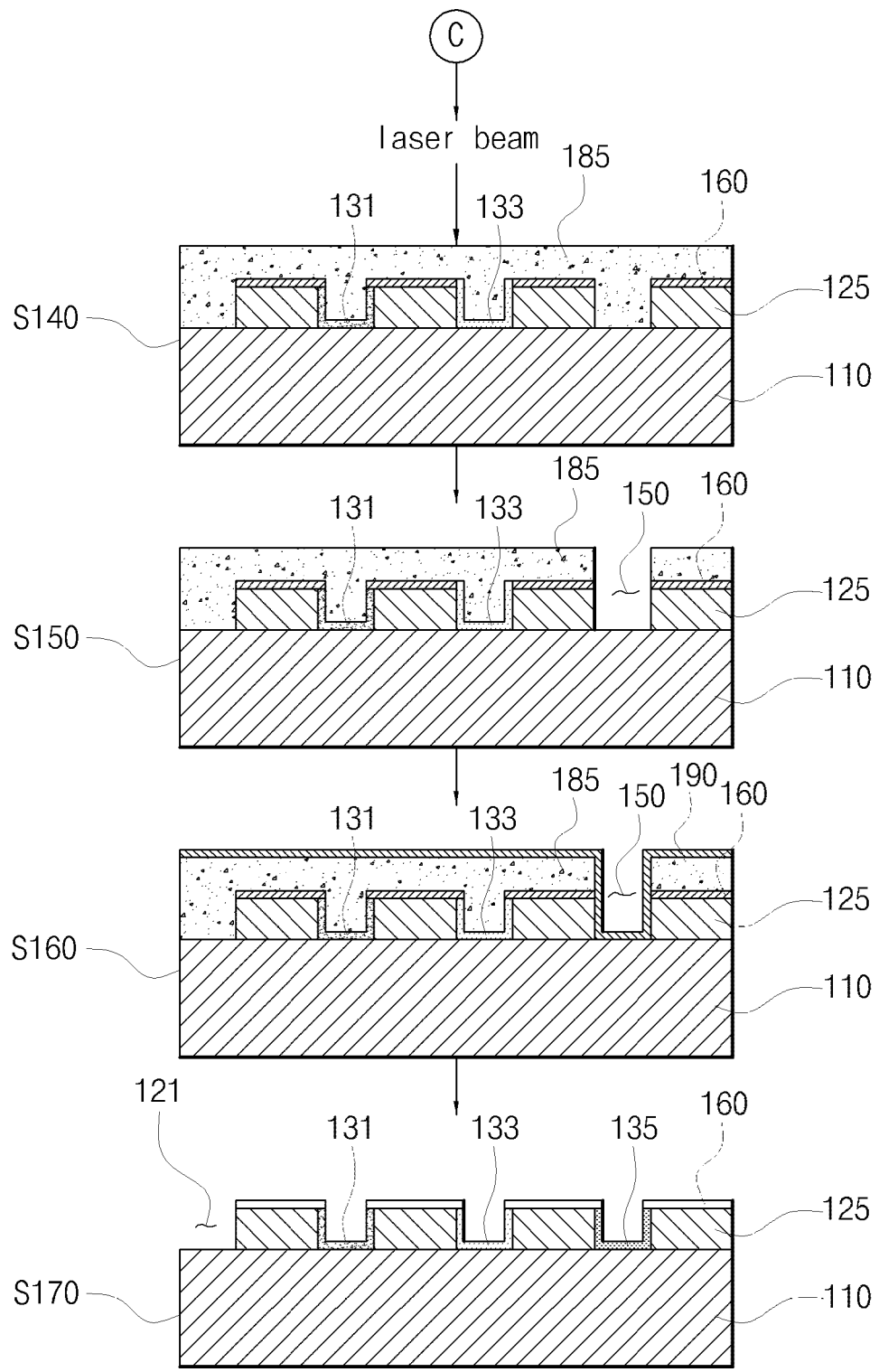
Figure 7:
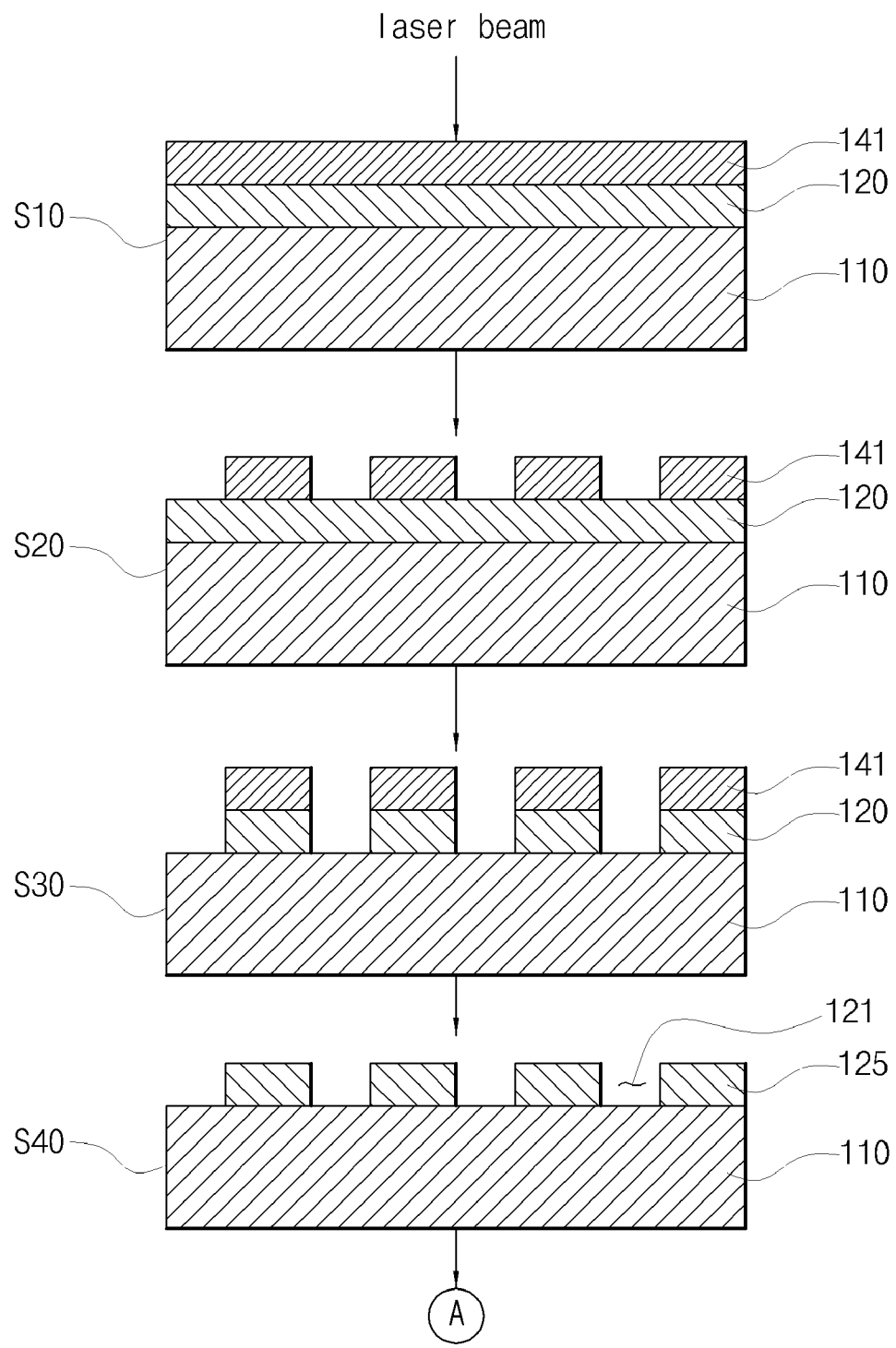
FIGS. 7 to 10 are respectively flow charts illustrating a second process of manufacturing the half tone mask having the multi semi-transmission part according to one exemplary embodiment of the present invention.
Figure 8:
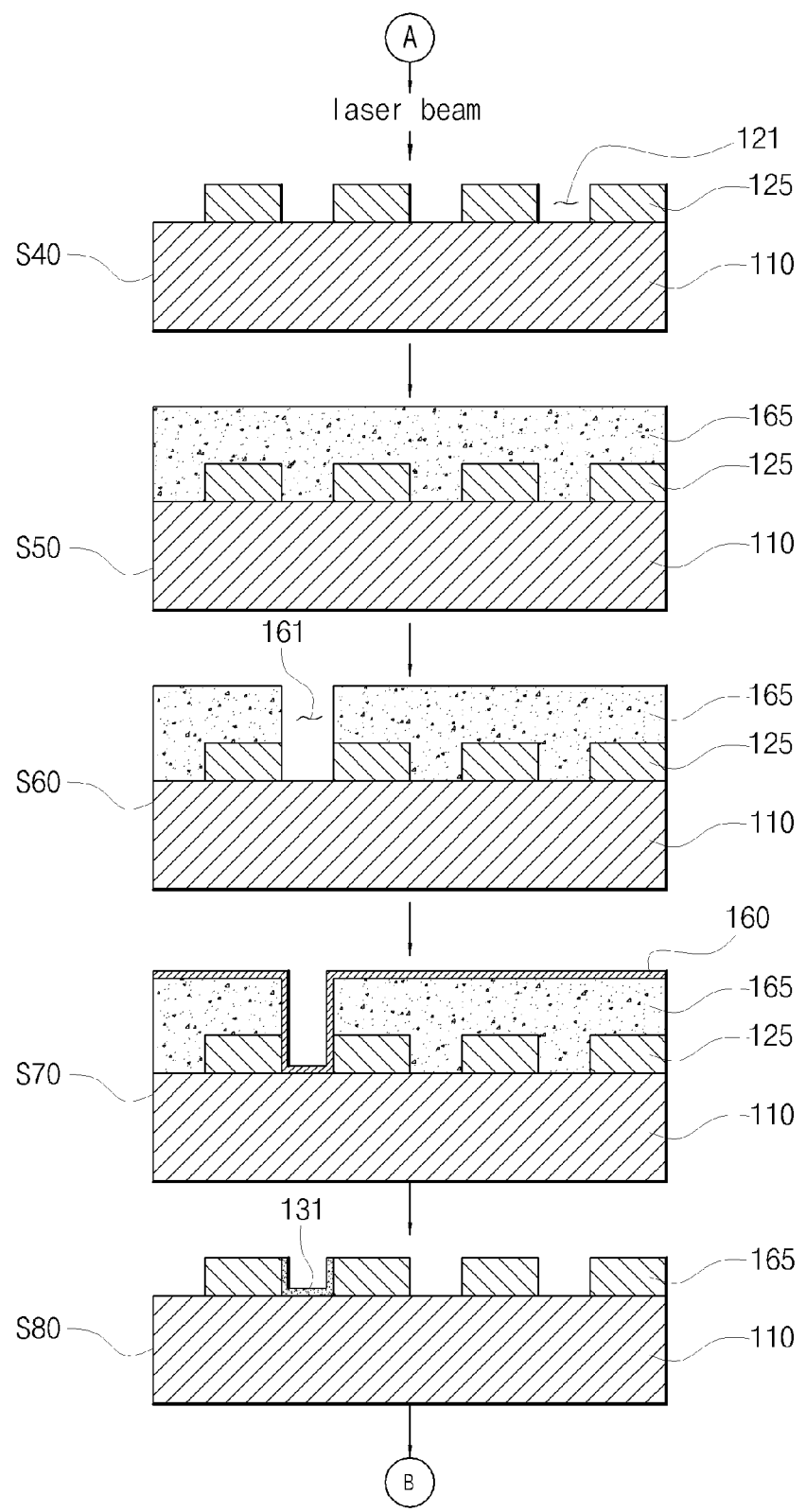

Referring to FIG. 2, the half tone mask 100 having the multi semi-transmission part according to one embodiment of the present invention includes a transparent substrate 110, a light shielding part 125, a light transmission part 121 and a plurality of semi-transmission parts 130.

The transparent substrate 110 is usually made of quartz (Qz), but not limited thereto. The transparent substrate 110 may be usually made of transparent material that can transmit light. The light shielding part 125 and the light transmission part 121 is formed by patterning a light-shielding material film deposited on the transparent substrate 110, more preferably, Cr, CrxOy or a mixed material thereof. However, the light-shielding material film includes all materials that can shield the light.

In other words, the light transmission part 121 for transmitting the light is a part of the transparent substrate 110 exposed by the patterning. The light shielding part 125 for shielding the light is a remaining part of the light-shielding material film after the patterning. In other words, the light shielding part 125 is formed of the light-shielding material film.

Meanwhile, the semi-transmission part 130 is formed on the transparent substrate 110 of the light transmission part 121. The semi-transmission part 130 transmits a part of light having a predetermined wavelength band irradiated by depositing the semi-transmission material consisted of various compositions.

According to one embodiment of the present invention, the semi-transmission parts 130 is formed to be multiple, and the multi semi-transmission parts 130 respectively have light transmission that is different from each other. Three semi-transmission parts 131, 133 and 135 are shown in FIG. 2, but the number of semi-transmission parts can be changed, if necessary.

The light transmission of at least two or more of the semi-transmission parts 130 can be controlled according to thickness or composition of the deposited semi-transmission material. In other words, the light transmission can be controlled according to the properties of the composition consisting of the semi-transmission material, or thickness even when the same composition is used.

The semi-transmission material may include Cr, Si, Mo, Ta, Ti and Al as major elements, and be mixed complex of at least two or more of major elements consisting of Cr, Si, Mo, Ta, Ti, Al or an additive of at least one elements selected from Cox, Ox and Nx, where x is a natural number that is changed according to the major element.

The composition of the semi-transmission part 130 can be variously made, if it passes through only one part of the irradiation light having the predetermined wavelength band. For example, the semi-transmission part 130 may be formed of any one of CrxOy, CrxCOy, CrxOyNz, SixOy, SixOyNz, SixCOy, SixCOyNz, MoxSiy, MoxOy, MoxOyNz, MoxCOy, MoxOyNz, MoxSiyOz, MoxSiyOzN MoxSiyCOzN, MoxSiyCOz, TaxOy, TaxOyNz, TaxCOy, TaxOyNz, AlxOy, AlxCOy, AlxOyNz, AlxCOyNz, TixOy, TixOyNz, TixCOy, or the combination thereof. More preferably, the semi-transmission part 130 is formed of chromium including oxygen (CrxOy), where x, y and z is a natural number, and means the number of chemical hydrators.

The irradiated light is not limited separately, because the wavelength band of the light can be changed according to an exposure system. However, the irradiated light usually uses the wavelength band of 300 nm~440 nm. It is desirable that the semi-transmission part 130 can transmit a part of the irradiated light, preferably 10%~90% of the irradiated light, but not limited thereto.

Next, a first process of manufacturing a half tone mask having multi semi-transmission parts will be explained with reference to FIGS. 3 to 6.

First, the light-shielding material film 120 and a first positive photoresist 141 are sequentially formed on the transparent substrate 110, and a laser beam is irradiated to an upper surface of the first positive photoresist 141 so as to draw a desired pattern on the first positive photoresist 141 S10. The light-shielding material film 120 is formed by patterning Cr, CrxOy or the mixed material thereof, preferably light shielding material.

A portion of the first positive photoresist 141 where the laser beam is irradiated is removed by a development process S20. A portion of the light-shielding material film 120 exposed outwardly by removing the first positive photoresist 141 is removed by an etching process S30.

The first positive photoresist 141 is perfectly removed S40. A portion of the light-shielding material film 120, where the first positive photoresist 141 is removed, becomes the light transmission part 121 for transmitting completely the irradiation light having the predetermined wavelength band. A portion of the light-shielding material film 120, where the first positive photoresist 141 is not removed, becomes the light shielding part 125 for shielding completely the irradiation light having the predetermined wavelength band. The light transmission part 121 and the light shielding part 125 are formed on the light shielding layer 120 in a photolithography process.

Next, the semi-transmission part 130 for transmitting only one part of the irradiation light having the predetermined wavelength band is formed. This will be explained in detail below.

A semi-transmission material film 160 for transmitting only a part of the light of the predetermined wavelength band irradiated on the light transmission part 121 and the light shielding part 125 is formed by the deposition process S50. The semi-transmission material film 160 is formed by a sputtering coating process. The semi-transmission material film 160 is consisted of chemical composition that can pass through only a part of the irradiated light having the predetermined wavelength band.

After forming the semi-transmission material film 160 in the step S50, a second positive photoresist 145 is coated on the semi-transmission material film 160 S60. In the step S60, the second positive photoresist 145 is exposed and drawn by irradiating the laser beam so that a predetermined portion of the semi-transmission material film 160 is exposed to the outside. The portion of second positive photoresist 145 irradiated by the laser beam is developed and removed S70. The portion of the semi-transmission material film 160 exposed to the outside is an upper surface of the transparent substrate 110, where the semi-transmission material film 160 is deposited, except a portion where the semi-transmission part 131 will be formed.

Next, the exposed portion of the semi-transmission material film 160 performs a wet etching so as to expose a predetermined portion of the transparent substrate 110 to the outside S80. The second positive photoresist 145 existing on semi-transmission material film 160, where the wet etching is not performed, is removed S90. The semi-transmission material film 160 remains on a part of each upper surface of the light shielding part 125 and the transparent substrate 110. The semi-transmission material film 160 remaining on the part of the upper surface of the transparent substrate 110 is a first semi-transmission part 131. The first semi-transmission part 131 is called "a basic semi-transmission part 131" below.

In other words, the chemical composition that can transmit a part of the light having the predetermined wavelength band irradiated on a portion of the light transmission part 121 is coated on the basic semi-transmission part 131. Accordingly, the basic semi-transmission part 131 transmits only a part of the irradiated light having the predetermined wavelength band. The light transmission of the basic semi-transmission part 131 can be controlled according to a composition rate of the chemical composition and its thickness that can transmit only a part of the irradiated light having the predetermined wavelength band.

The semi-transmission material may include Cr, Si, Mo, Ta, Ti and Al as major elements, and be mixed complex of at least two or more of major elements consisting of Cr, Si, Mo, Ta, Ti, Al or an additive of at least one elements selected from Cox, Ox and Nx, where x is a natural number that is changed according to the major element.

The composition of the semi-transmission part 130 can be variously made, if it passes through only one part of the irradiation light having the predetermined wavelength band. For example, the semi-transmission part 130 may be formed of any one of CrxOy, CrxCOy, CrxOyNz, SixOy, SixOyNz, SixCOy, SixCOyNz, MoxSiy, MoxOy, MoxOyNz, MoxCOy, MoxOyNz, MoxSiyOz, MoxSiyOzN MoxSiyCOzN, MoxSiyCOz, TaxOy, TaxOyNz, TaxCOy, TaxOyNz, AlxOy, AlxCOy, AlxOyNz, AlxCOyNz, TixOy, TixOyNz, TixCOy, or the combination thereof. More preferably, the semi-transmission part 130 is formed of chromium including oxygen (CrxOy), where x, y and z is a natural number, and means the number of chemical hydrators.

Hereafter, the composition of a semi-transmission part that will be formed below is the same as that of the above-described semi-transmission part. The light transmission can be changed according to kinds and thickness of the composition.

The irradiated light is not limited separately, because the wavelength band of the light can be changed according to an exposure system. However, the irradiated light usually uses the wavelength band of 300 nm~440 nm. It is desirable that the basic semi-transmission part 130 can transmit a part of the irradiated light, more preferably 10%~90% of the irradiated light, but not limited thereto.

As described above, after forming the basic semi-transmission part 131, the basic semi-transmission part 131 and a separate semi-transmission part having different light transmission can be formed to be multiple. In other words, in the step S90, the semi-transmission material consisted of the predetermined chemical composition is deposited on the light transmission part 121 so as to form the basic semi-transmission part 131 and at least one additional semi-transmission part having different light transmission. Hereafter, the semi-transmission part having the light transmission different from the basic semi-transmission part 131 is called "additional semi-transmission."

To form a second semi-transmission, i.e., the additional semi-transmission part 133, a third photoresist 175 is coated on the light transmission part, the semi-transmission part 131 and the light shielding part S100.

Next, a laser beam is irradiated on an upper surface of the third photoresist 175 so as to draw a desired pattern on the third photoresist 175. The irradiated portion of the third photoresist 175 is developed and removed S110. A space part 170, where the additional semi-transmission part 133 will be formed, is formed, like the step S110.

In other words, the third photoresist 175 is exposed and developed so as to expose only the light transmission part 121 that corresponds to a portion where the additional semi-transmission part 133 will be formed.

As described above, after exposing and developing the third photoresist 175, the semi-transmission material is formed on an upper surface of the exposed light transmission part 121, i.e., each upper surface of the space part 170 and the third photoresist 175 S120.

In other words, in the step S120, the space part 170 and a semi-transmission material film 180 are formed by the deposition process, where the semi-transmission material film 180 transmits only a part of the light having the predetermined wavelength band irradiated on the third photoresist 175. The semi-transmission material film 180 is formed by the sputtering coating process. The semi-transmission material film 180 is consisted of the chemical composition that can pass through only the part of the irradiated light having the predetermined wavelength band.

Next, the third photoresist 175 and the semi-transmission material film 180 deposited on an upper surface of the third photoresist 175 are removed by a lift-off method. The semi-transmission material film 180 remains only on the upper surface of the exposed light transmission part and the space part 170 where the additional semi-transmission part 133 will be formed. The remaining semi-transmission material film 180 is the additional semi-transmission part 133 that corresponds to the third semi-transmission part 130.

The light transmission of the additional semi-transmission part 133 can be controlled according to the composition rate that can pass through only the part of the irradiated light having the predetermined wavelength band and its thickness.

As described above, the second semi-transmission part 133 is formed through the steps S100~S130. In other words, the light transmission part having the light transmission different from the basic semi-transmission part 131, i.e., the second additional semi-transmission part 133 is formed. Each of the light transmissions of the basic semi-transmission part 131 and the second additional semi-transmission part 133 can be controlled according to the composition or thickness of the deposited semi-transmission material.

If the steps S100~S130 are repeated, the additional semi-transmission part is additionally formed. However, since the additionally formed additional semi-transmission part is formed on the light transmission part 121 where the transparent substrate 110 is exposed, an exposure region and development region of the photoresist become different. In other words, to form additionally the additional semi-transmission part, forming the additional semi-transmission part is repeated. Consequently, unlimited semi-transmission parts can be formed, if necessary.

Hereafter, a process of forming an additional semi-transmission part corresponding to a third semi-transmission part 135 will be briefly explained.

When two semi-transmission parts 131 and 133 have been formed, a fourth photoresist 185 is formed on the semi-transmission parts 131 and 133, the light shielding part 125 and the light transmission part by coating S140. Then, the laser beam is irradiated so as to expose a desired part of the fourth photoresist 185, and the exposed part is developed S150. As a result, a space part, where the third semi-transmission part 135 will be formed, is formed.

After forming the space part 150, a semi-transmission material film 190 is deposited on an upper surface of the fourth photoresist 185.

Next, a semi-transmission material film 190 is deposited to transmit a part of the light having the predetermined wavelength band irradiated on the space part 150 and the fourth photoresist 185 S160. The semi-transmission material film 190 is formed by the sputtering coating process. The semi-transmission material film 190 is consisted of the chemical composition that can pass through only a part of the light having the predetermined wavelength band.

Next, the fourth photoresist 185 and the semi-transmission material film 190 deposited on an upper surface of the fourth photoresist 185 are removed by the lift-off method. The semi-transmission material film 190 remains only on the upper surface of the exposed light transmission part and the space part 150 where the additional semi-transmission part 135 will be formed. The remaining semi-transmission material film 190 is the additional semi-transmission part 135 that corresponds to the second semi-transmission part 135.

The light transmission of the additional semi-transmission part 135 can be controlled according to the composition rate that can pass through only the part of the irradiated light having the predetermined wavelength band and its thickness.

As described above, the third semi-transmission part 133 is formed through the steps S140~S170. In other words, the third light transmission 135 having the light transmission different from the basic semi-transmission part 131 and the second additional semi-transmission part 133 is formed. Each the light transmission of the basic semi-transmission part 131 and the second additional semi-transmission part 133 can be controlled according to the composition or thickness of the deposited semi-transmission material.

If the above-described processes are repeated, a plurality of semi-transmission parts can be formed. Using the formed semi-transmission parts, a plurality of layers can be patterned. A half tone mask having a multi semi-transmission part formed by the processes can be used to manufacture various kinds of flat panel display elements.

Next, a second process of manufacturing the half tone mask having the multi semi-transmission part according to one embodiment of the present invention will be explained. FIGS. 7 to 10 show the second process of manufacturing the half tone mask having the multi semi-transmission part according to one embodiment of the present invention. The second process is performed differently from the first process.

First, the light-shielding material film 120 and a first positive photoresist 141 are sequentially formed on the transparent substrate 110 made of quartz (Qz), and a laser beam is irradiated to an upper surface of the first positive photoresist 141 so as to draw a desired pattern on the first positive photoresist 141 S10. The light-shielding material film 120 is formed by patterning Cr, CrxOy or the mixed material thereof, preferably light shielding material.

A portion of the first positive photoresist 141 where the laser beam is irradiated is removed by a development process S20. A portion of the light-shielding material film 120 exposed outwardly by removing the first positive photoresist 141 is removed by an etching process S30.

The first positive photoresist 141 is perfectly removed S40. A portion of the light-shielding material film 120, where the first positive photoresist 141 is removed, becomes the light transmission part 121 for transmitting completely the irradiation light having the predetermined wavelength band. A portion of the light-shielding material film 120, where the first positive photoresist 141 is not removed, becomes the light shielding part 125 for shielding completely the irradiation light having the predetermined wavelength band. The light transmission part 121 and the light shielding part 125 are formed on the light shielding layer 120 in a photolithography process.

Next, the semi-transmission part 130 for transmitting only one part of the irradiation light having the predetermined wavelength band is formed. This will be explained in detail below.

A second photoresist 165 is separately formed on the light transmission part 121 and the light shielding part 125 S50. This is different from the one embodiment that the semi-transmission material film is deposited on the light transmission part 121 and the light shielding part 125 by the sputtering process.

Next, the laser beam is irradiated on the upper surface of the second photoresist 165 so as to draw a desired pattern on the second photoresist 165. The irradiated region of the second photoresist 165 is removed by the development process S60. Then, the space part 161, in which the semi-transmission part 131 will be formed, is formed.

In other words, the second photoresist 165 is exposed and developed so as to expose the light transmission part 121 that corresponds to a region where the semi-transmission part 131 will be formed.

As described above, after exposing and developing the second photoresist 165, the semi-transmission material is formed on the upper surface of the exposed light transmission part, i.e., the upper surface of the space part 161, where the semi-transmission part 131 will be formed, and the upper surface of the second photoresist 165 S70.

In other words, the semi-transmission material film 160, which transmits a part of the light having the predetermined wavelength band irradiated on the space part 161 and the second photoresist 165 is formed by the deposition process. The semi-transmission material film 160 is formed by the sputtering coating process. The semi-transmission material film 160 is consisted of the chemical composition that can pass through the part of the light having the predetermined wavelength band S70.

Next, the second photoresist 165 and the semi-transmission material film 160 deposited on an upper surface of the third photoresist 165 are removed by a lift-off method S80. The semi-transmission material film 160 remains only on the upper surface of the exposed light transmission part and the space part 161 where the additional semi-transmission part 131 will be formed. The remaining semi-transmission material film 160 is the semi-transmission part 131. The first formed semi-transmission part 131 is called "a basic semi-transmission part 131."

The light transmission of the basic semi-transmission part 131 can be controlled according to the composition rate that can pass through only the part of the irradiated light having the predetermined wavelength band and its thickness.

After forming the basic semi-transmission part 131, a separate semi-transmission part having the light transmission different from the basic semi-transmission part 131 can be formed to be multiple. In other words, at least one additional semi-transmission part having the light transmission different from the basic semi-transmission part 131 may be formed by depositing the semi-transmission material consisted of the predetermined chemical composition on the light transmission part 121, i.e., a region where the basic semi-transmission part 131 is not formed (i.e., a region where the transparent substrate 110 is not exposed). A semi-transmission part having the light transmission different from the basic semi-transmission 131 is called the additional semi-transmission part.

Figure 9:
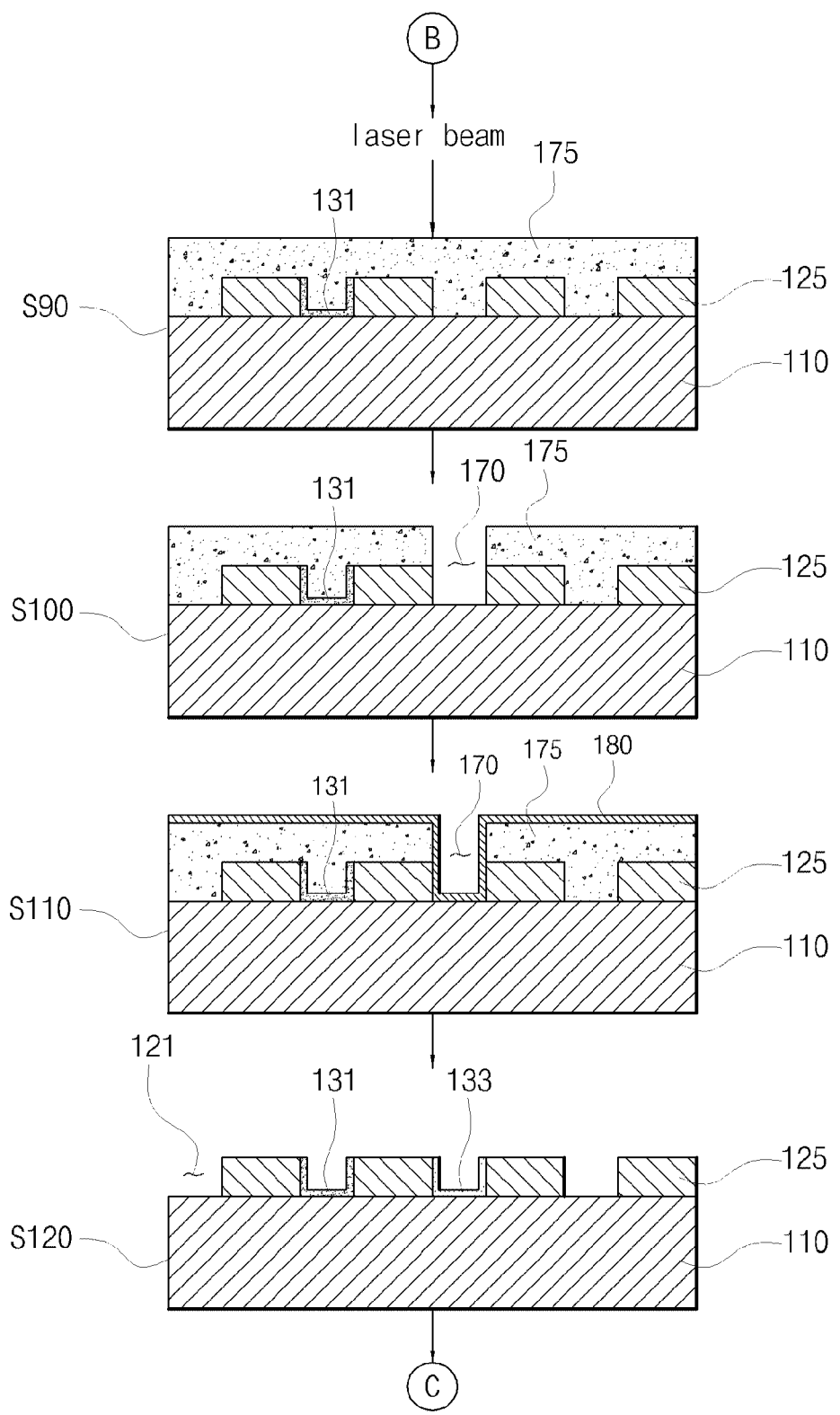
Figure 10:
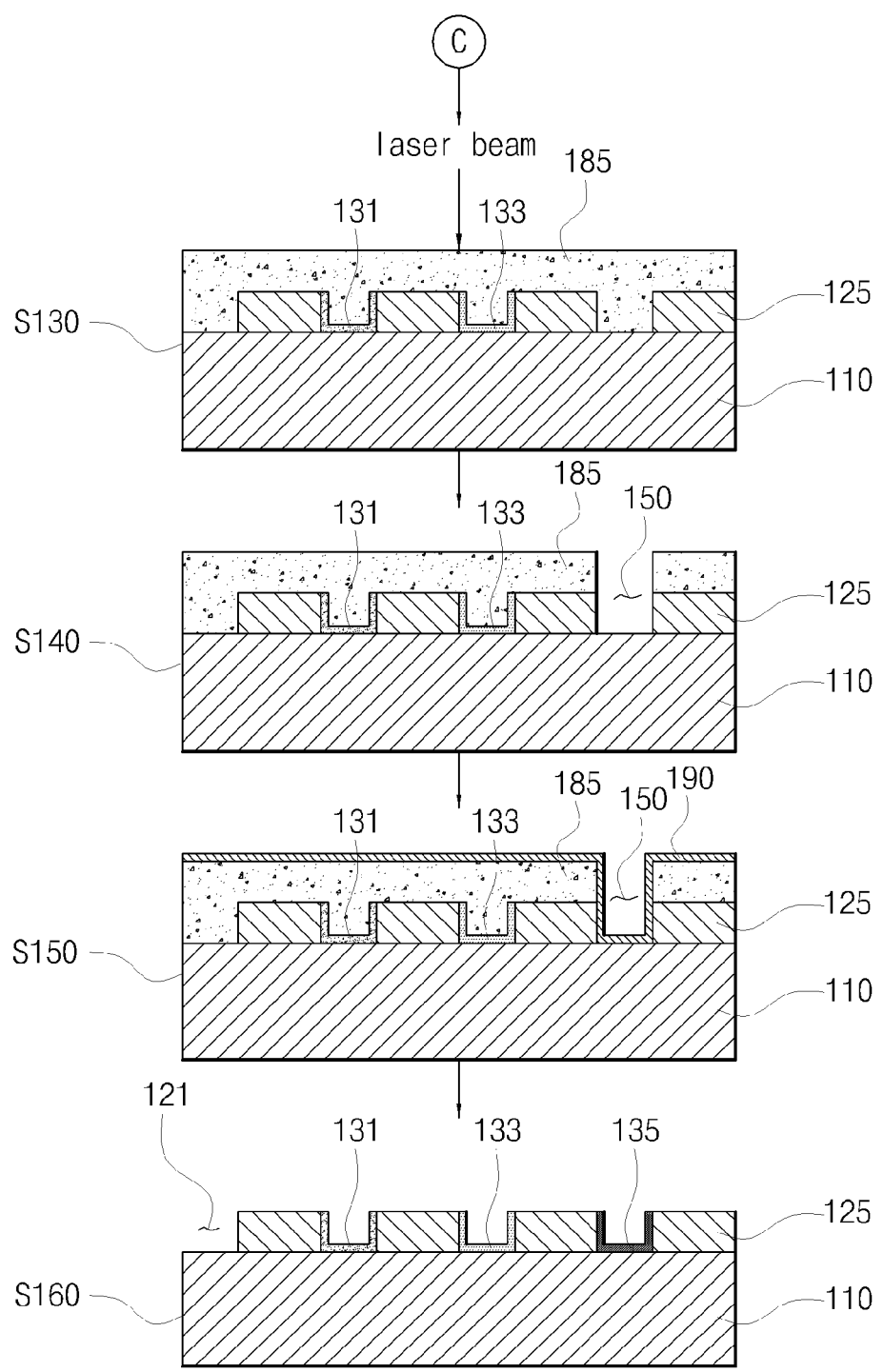

A first additional semi-transmission part followed by the basic semi-transmission part 131 is formed through the steps S90~S120 of FIG. 9. Since the first additional semi-transmission part is formed by the same process as the first process of FIG. 5, the additional explanation will be omitted.

As the processes of FIG. 9 are repeated after forming the first additional semi-transmission part, a plurality of the additional semi-transmission parts can be continuously formed. In other words, a second additional semi-transmission part may be formed by the processes of FIG. 10. Since the processes of forming the second semi-transmission part is the same as those of the first process of FIG. 6, the explanation will be omitted.

A half tone mask having a multi semi-transmission part and a manufacturing method thereof according to another embodiment of the present invention will be explained below.

Figure 11:
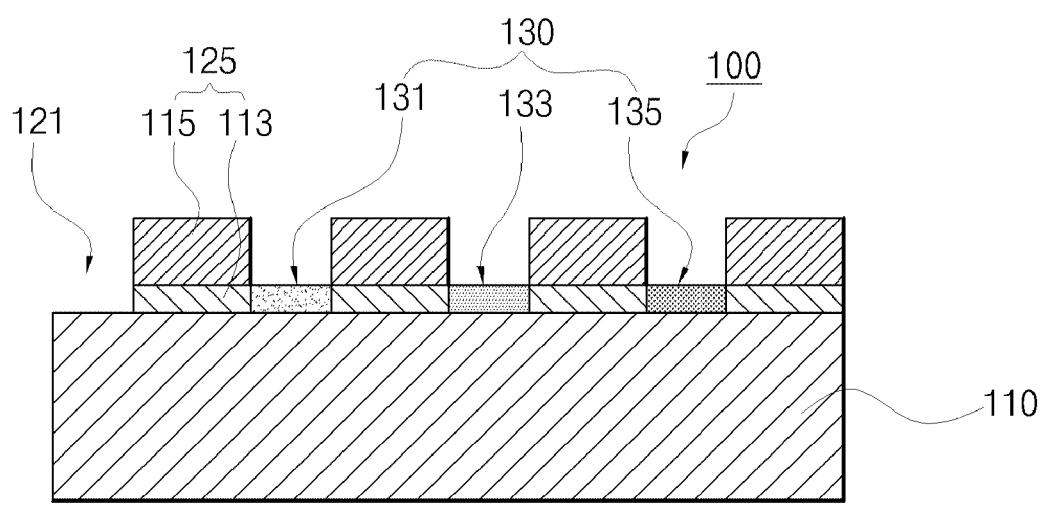
FIG. 11 is a schematic diagram illustrating a half tone mask having a multi semi-transmission part according to second exemplary embodiment of the present invention.

Referring to FIG. 11, the half tone mask 100 having the multi semi-transmission part according to another embodiment of the present invention includes a transparent substrate 110, a light shielding part 125, a light transmission part 121 and a plurality of semi-transmission parts 130, similar to one embodiment of the present invention.

The transparent substrate 110 is usually made of quartz (Qz), but not limited thereto. The transparent substrate 110 may be usually made of transparent material that can transmit light. The light shielding part 125 and the light transmission part 121 are formed by patterning a light-shielding material film 113 and the light shielding material film 115 deposited on the transparent substrate 110.

In other words, the light transmission part 121 for transmitting the light is a part of the transparent substrate 110 exposed by the patterning. The light shielding part 125 for shielding the light is a remaining part of the semi-transmission material film 113 and the light-shielding material film 115 after the patterning. In other words, the light shielding part 125 is formed by depositing the semi-transmission material film 113 and the light-shielding material film 115 sequentially, differently from the light shielding part of one embodiment of the present invention (refer to FIG. 2).

The semi-transmission material may include Cr, Si, Mo, Ta, Ti and Al as major elements, and be mixed complex of at least two or more of major elements consisting of Cr, Si, Mo, Ta, Ti, Al or an additive of at least one elements selected from Cox, Ox and Nx, where x is a natural number that is changed according to the major element.

The light-shielding material film 115 is formed by depositing Cr or CrxOy or the mixed material thereof on the semi-transmission material film 113. The light-shielding material film 115 may be made of any one of all material that can shield the light.

Meanwhile, the semi-transmission part 130 is formed on the transparent substrate 110 of the light transmission part 121. The semi-transmission part 130 transmits a part of light having a predetermined wavelength band irradiated by depositing the semi-transmission material consisted of various compositions.

According to one embodiment of the present invention, the semi-transmission parts 130 is formed to be multiple, and the multi semi-transmission parts 130 respectively have light transmission that is different from each other. Three semi-transmission parts 131, 133 and 135 are shown in FIG. 11, but the number of semi-transmission parts can be changed, if necessary.

The light transmission of at least two or more of the semi-transmission parts 130 can be controlled according to thickness or composition of the deposited semi-transmission material. In other words, the light transmission can be controlled according to the properties of the composition consisting of the semi-transmission material, or thickness even when the same composition is used.

The semi-transmission material may include Cr, Si, Mo, Ta, Ti and Al as major elements, and be mixed complex of at least two or more of major elements consisting of Cr, Si, Mo, Ta, Ti, Al or an additive of at least one elements selected from Cox, Ox and Nx, where x is a natural number that is changed according to the major element.

The composition of the semi-transmission part 130 can be variously made, if it passes through only one part of the irradiation light having the predetermined wavelength band. For example, the semi-transmission part 130 may be formed of any one of CrxOy, CrxCOy, CrxOyNz, SixOy, SixOyNz, SixCOy, SixCOyNz, MoxSiy, MoxOy, MoxOyNz, MoxCOy, MoxOyNz, MoxSiyOz, MoxSiyOzN MoxSiyCOzN, MoxSiyCOz, TaxOy, TaxOyNz, TaxCOy, TaxOyNz, AlxOy, AlxCOy, AlxOyNz, AlxCOyNz, TixOy, TixOyNz, TixCOy, or the combination thereof. More preferably, the semi-transmission part 130 is formed of chromium including oxygen (CrxOy), where x, y and z is a natural number, and means the number of chemical hydrators.

The irradiated light is not limited separately, because the wavelength band of the light can be changed according to an exposure system. However, the irradiated light usually uses the wavelength band of 300 nm~440 nm. It is desirable that the semi-transmission part 130 can transmit a part of the irradiated light, preferably 10%~90% of the irradiated light, but not limited thereto.

Next, a process of manufacturing a half tone mask having a multi semi-transmission part according to another embodiment of the present invention will be explained with reference to FIGS. 12 to 14.

Figure 12:
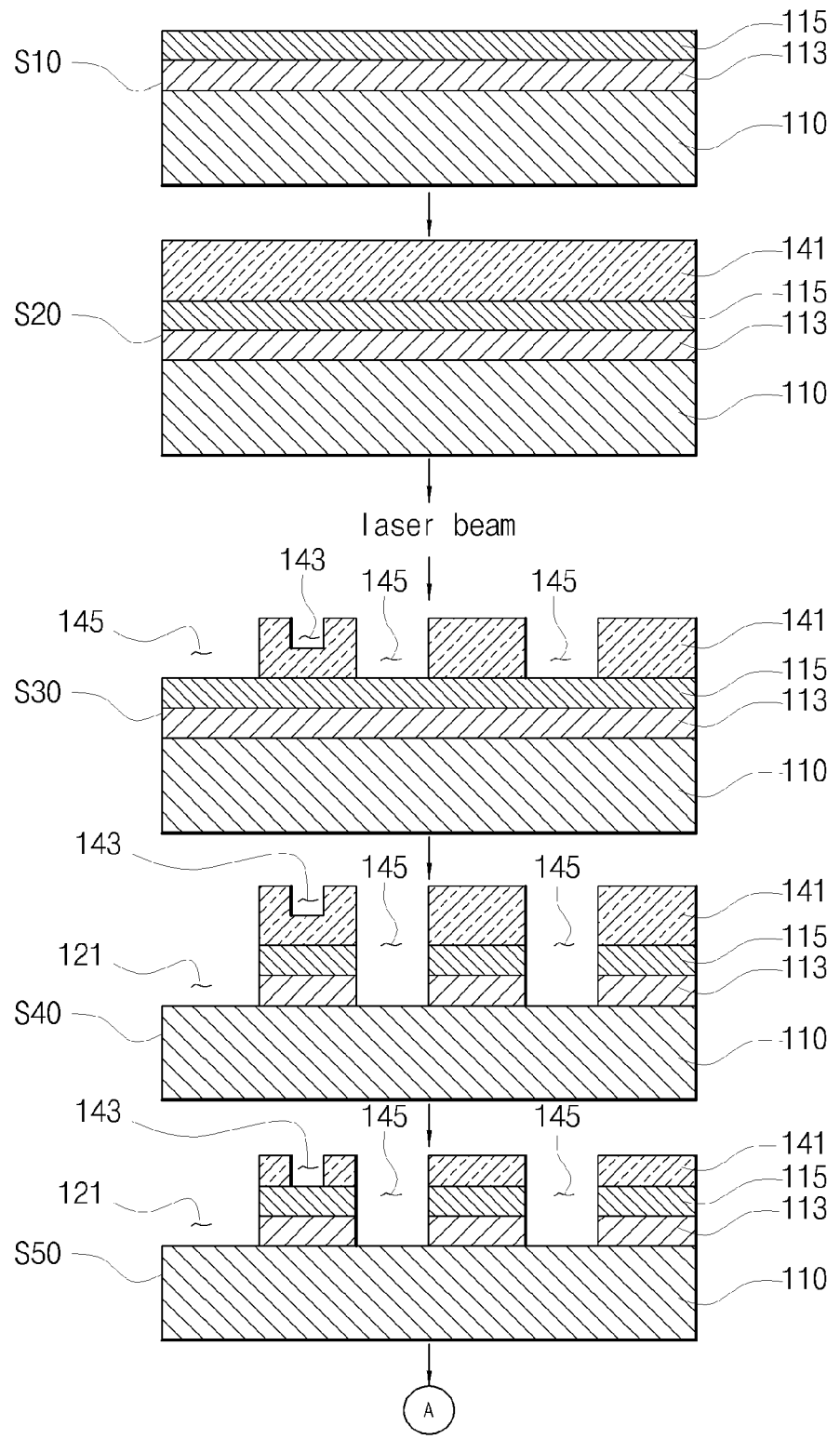
FIGS. 12 to 14 are respectively flow charts illustrating a process of manufacturing the half tone mask having the multi semi-transmission part according to another exemplary embodiment of the present invention.
Figure 13:
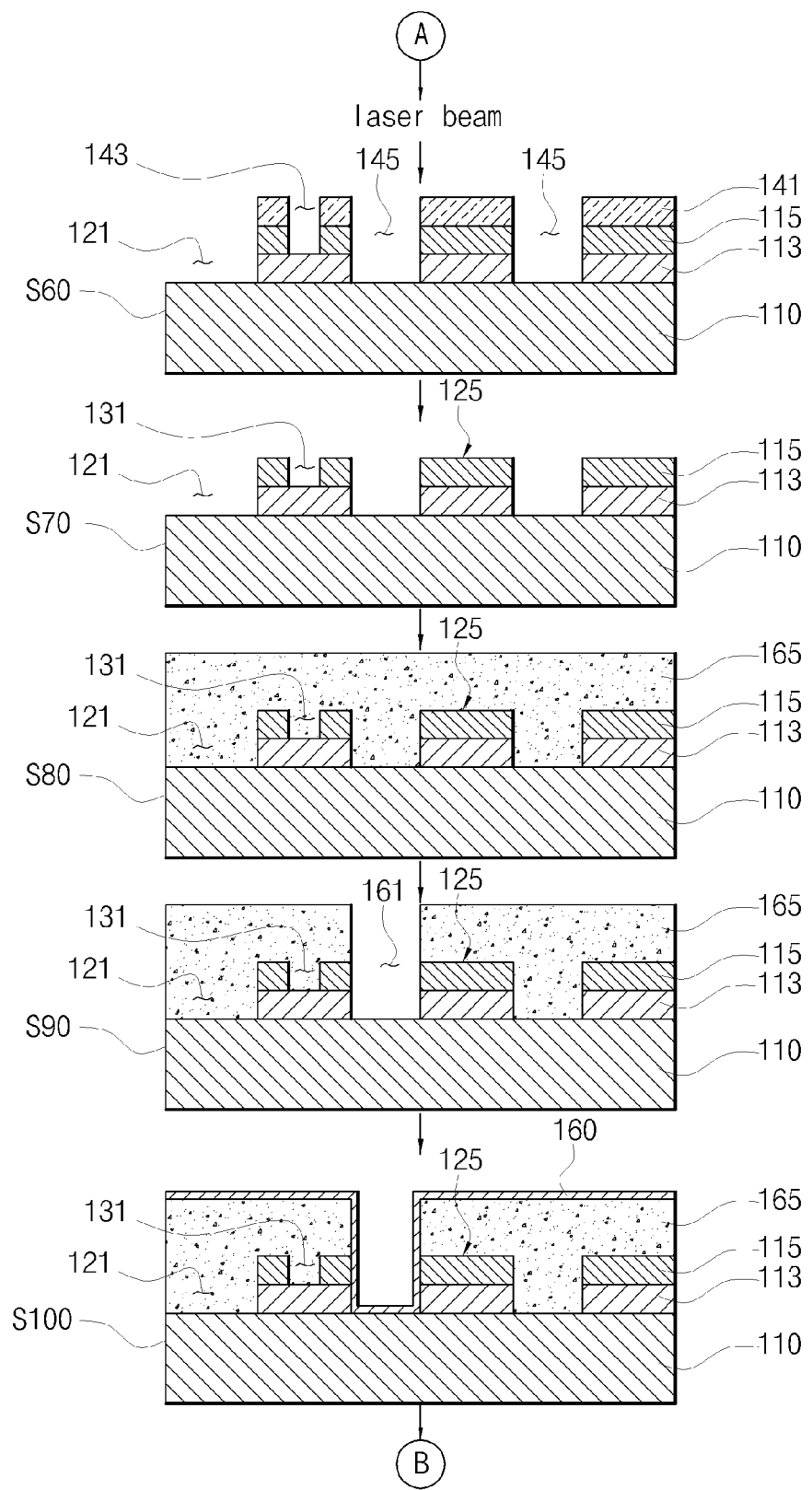
Figure 14:
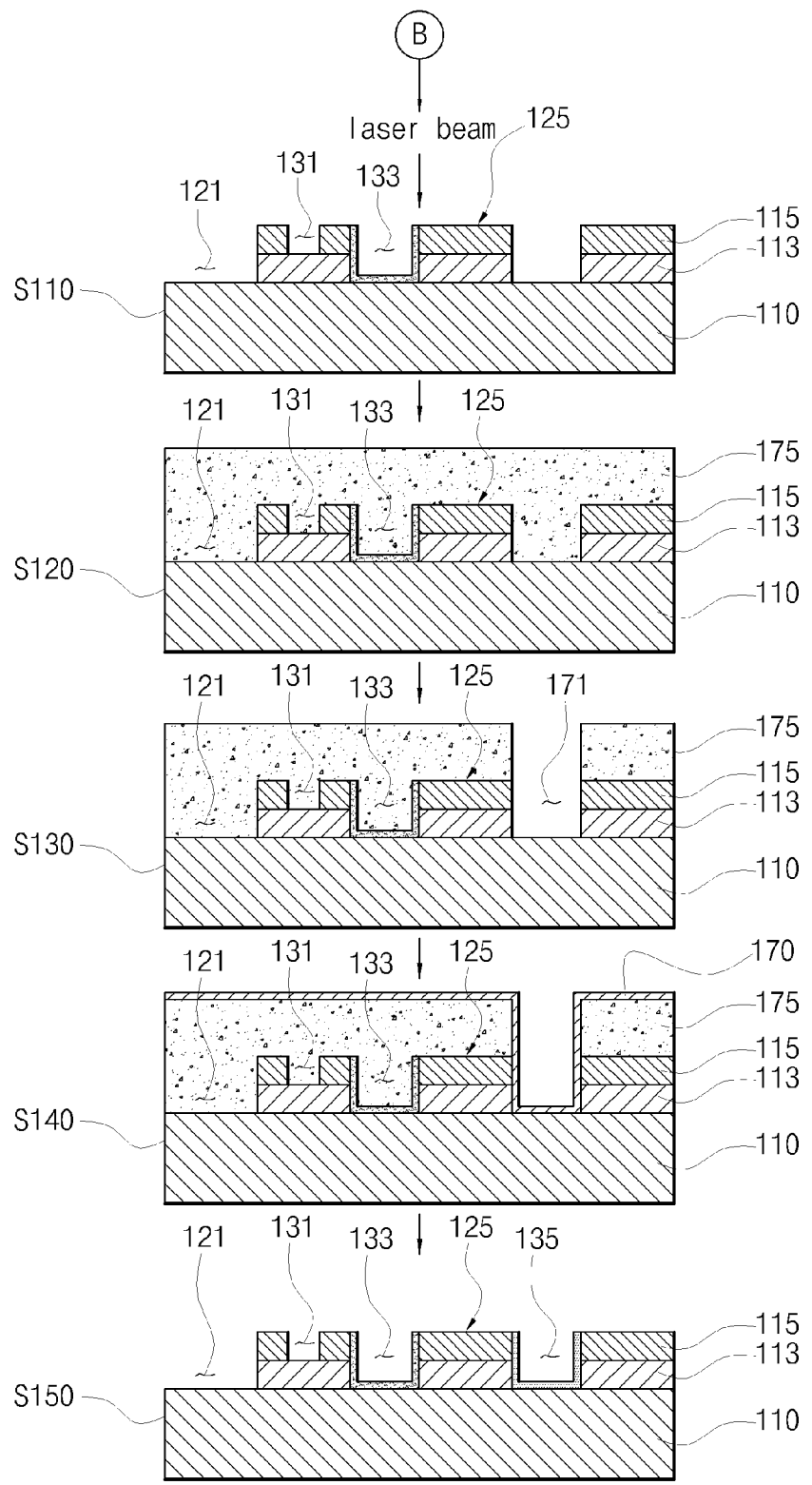

Referring to FIGS. 12 to 14, the semi-transmission material film 113 and the light-shielding material film 115 are sequentially formed on the transparent substrate 110 made of quartz (Qz) S10. The semi-transmission material may include Cr, Si, Mo, Ta, Ti and Al as major elements, and be mixed complex of at least two or more of major elements consisting of Cr, Si, Mo, Ta, Ti, Al or an additive of at least one elements selected from Cox, Ox and Nx, where x is a natural number that is changed according to the major element.

Next, the first positive photoresist 141 is formed on the light-shielding material film 115 S20. The laser beam is irradiated on the upper surface of the first positive photoresist 141 so as to draw the desired pattern on first positive photoresist 141.

The pattern is formed on the first positive photoresist 141 in a full exposure process and a half exposure process. In other words, the full exposure process is performed for entire thickness of the first positive photoresist 141 by receiving all of the irradiated light. The half exposure process is performed for fixed thickness of first positive photoresist 141 by receiving a part of the irradiated light.

If the exposed part of the first positive photoresist 141 is developed after performing the full exposure and half exposure processes, a full exposure region 145 and a half exposure region 143 are formed S30.

After the full exposure region 145 and the half exposure region 143 are formed, the light-shielding material film 115 exposed on the full exposure region 145 and the semi-transmission material film 113 existing on the lower part of the light-shielding material film 115 are sequentially etched. Then, the light transmission part 121, i.e., a portion that the transparent substrate 110 is exposed to the outside, is formed S40.

After forming the light transmission part 121 in the step S40, an ashing process is performed for the first positive photoresist 141. Then, the first positive photoresist 141 remaining on the half exposure region 143 is removed to expose the light-shielding material film 115 to the outside, and height of the first positive photoresist 141 is totally lowered.

As described above, when the light-shielding material film 115 located on the half exposure region 143 is exposed to the outside by performing the ashing process for the first positive photoresist 141, the exposed light-shielding material film 115 is partially etched so as to expose the semi-transmission material film 113 located on the lower part of the light-shielding material film 115 S60.

The exposed semi-transmission material film 113 is the first semi-transmission part 131. The first semi-transmission part 131 is called the basic semi-transmission part 131 below. After forming the basic semi-transmission part 131, the first positive photoresist 141 remaining on the light-shielding material film 115 is removed. Then, the light shielding part 125 formed by depositing the semi-transmission material film 113 and the light-shielding material film 115 is formed.

The light transmission of the basic semi-transmission part 131 can be controlled according to the chemical composition that can pass through only a part of the irradiated light having the predetermined wavelength band and its thickness.

The semi-transmission material may include Cr, Si, Mo, Ta, Ti and Al as major elements, and be mixed complex of at least two or more of major elements consisting of Cr, Si, Mo, Ta, Ti, Al or an additive of at least one elements selected from Cox, Ox and Nx, where x is a natural number that is changed according to the major element.

The composition of the semi-transmission part 131 can be variously made, if it passes through only one part of the irradiation light having the predetermined wavelength band. For example, the semi-transmission part 130 may be formed of any one of CrxOy, CrxCOy, CrxOyNz, SixOy, SixOyNz, SixCOy, SixCOyNz, MoxSiy, MoxOy, MoxOyNz, MoxCOy, MoxOyNz, MoxSiyOz, MoxSiyOzN MoxSiyCOzN, Mox-SiyCOz, TaxOy, TaxOyNz, TaxCOy, TaxOyNz, AlxOy, Alx-COy, AlxOyNz, AlxCOyNz, TixOy, TixOyNz, TixCOy, or the combination thereof. More preferably, the semi-transmission part 131 is formed of chromium including oxygen (CrxOy), where x, y and z is a natural number, and means the number of chemical hydrators.

The irradiated light is not limited separately, because the wavelength band of the light can be changed according to an exposure system. However, the irradiated light usually uses the wavelength band of 300 nm~440 nm. It is desirable that the semi-transmission part 131 can transmit a part of the irradiated light, preferably 10%~90% of the irradiated light, but not limited thereto.

As described above, after forming the basic semi-transmission part 131, the basic semi-transmission part 131 and a separate semi-transmission part having different light transmission can be formed to be multiple. In other words, in the step S80, the semi-transmission material consisted of the predetermined chemical composition is deposited on the light transmission part 121 so as to form the basic semi-transmission part 131 and at least one additional semi-transmission part having different light transmission. Hereafter, the semi-transmission part having the light transmission different from the basic semi-transmission part 131 is called "additional semi-transmission."

To form a second semi-transmission, i.e., the additional semi-transmission part 133, the second photoresist 165 is coated on the light transmission part, the semi-transmission part 131 and the light shielding part S80.

Next, the laser beam is irradiated on the upper surface of the second photoresist 165 so as to draw a desired pattern on the second photoresist 165. The irradiated portion of the second photoresist 165 is developed and removed S90. The space part 161, where the additional semi-transmission part 133 will be formed, is formed, like the step S90.

In other words, the second photoresist 165 is exposed and developed so as to expose only the light transmission part 121 that corresponds to a portion where the additional semi-transmission part 133 will be formed.

As described above, after exposing and developing the second photoresist 165, the semi-transmission material is formed on the upper surface of the exposed light transmission part 121, i.e., each upper surface of the space part 161 and the second photoresist 165 S100.

In other words, the space part 170 and a semi-transmission material film 180 are formed by the deposition process, where the semi-transmission material film 160 transmits only a part of the light having the predetermined wavelength band irradiated on the second photoresist 165. The semi-transmission material film 160 is formed by the sputtering coating process. The semi-transmission material film 160 is consisted of the chemical composition that can pass through only the part of the irradiated light having the predetermined wavelength band S100.

Next, the second photoresist 165 and the semi-transmission material film 160 deposited on an upper surface of the second photoresist 165 are removed by the lift-off method S110. The semi-transmission material film 160 remains only on the upper surface of the exposed light transmission part and the space part 161 where the additional semi-transmission part 133 will be formed. The remaining semi-transmission material film 160 is the additional semi-transmission part 133 that corresponds to the third semi-transmission part 133.

The light transmission of the additional semi-transmission part 133 can be controlled according to the composition rate that can pass through only the part of the irradiated light having the predetermined wavelength band and its thickness.

As described above, the second semi-transmission part 133 is formed through the steps S80~S110. In other words, the light transmission part having the light transmission different from the basic semi-transmission part 131, i.e., the second additional semi-transmission part 133 is formed. Each the light transmission of the basic semi-transmission part 131 and the second additional semi-transmission part 133 can be controlled according to the composition or thickness of the deposited semi-transmission material.

If the steps S80~S110 are repeated, the additional semi-transmission part is additionally formed. However, since the additionally formed additional semi-transmission part is formed on the light transmission part 121 where the transparent substrate 110 is exposed, the exposure region and development region of the photoresist become different. In other words, to form additionally the additional semi-transmission part, forming the additional semi-transmission part is repeated. Consequently, an unlimited semi-transmission part can be formed, if necessary.

Hereafter, a process of forming an additional semi-transmission part corresponding to a third semi-transmission part 135 will be briefly explained.

When two semi-transmission parts 131 and 133 have been formed, the third photoresist 175 is formed on the semi-transmission parts 131 and 133, the light shielding part 125 and the light transmission part with coating S120. Then, the laser beam is irradiated so as to expose a desired part of the third photoresist 175, and the exposed part is developed S130. As a result, a space part 171, where the third semi-transmission part 135 will be formed, is formed.

After forming the space part 171, the semi-transmission material film 170 is deposited on the upper surface of the third photoresist 175 and the space part 171.

Next, the semi-transmission material film 170 is deposited to transmit a part of the light having the predetermined wavelength band irradiated on the space part 171 and the third photoresist 175 S140. The semi-transmission material film 170 is formed by the sputtering coating process. The semi-transmission material film 170 is consisted of the chemical composition that can pass through only a part of the light having the predetermined wavelength band.

Next, the third photoresist 175 and the semi-transmission material film 170 deposited on an upper surface of the third photoresist 175 are removed by the lift-off method. The semi-transmission material film 170 remains only on the upper surface of the exposed light transmission part and the space part 171 where the additional semi-transmission part 135 will be formed. The remaining semi-transmission material film 170 is the additional semi-transmission part 135 that corresponds to the second semi-transmission part 135.

The light transmission of the additional semi-transmission part 135 can be controlled according to the composition rate that can pass through only the part of the irradiated light having the predetermined wavelength band and its thickness.

As described above, the third semi-transmission part 133 is formed through the steps S120~S150. In other words, the third light transmission 135 having the light transmission different from the basic semi-transmission part 131 and the second additional semi-transmission part 133 is formed. Each the light transmission of the basic semi-transmission part 131 and the second additional semi-transmission part 133 can be controlled according to the composition or thickness of the deposited semi-transmission material.

If the above-described processes are repeated, a plurality of semi-transmission parts can be formed. Using the formed semi-transmission parts, a plurality of layers can be patterned. A half tone mask having a multi semi-transmission part formed by the processes can be used to manufacture various kinds of flat panel display elements.

Next, preferred embodiments of a half tone mask having a multi semi-transmission part and a manufacturing method thereof according to still another embodiment of the present invention will be explained.

Figure 15:
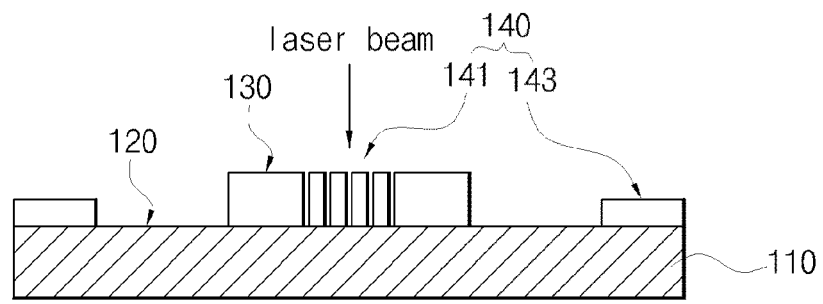
FIGS. 15 to 17 are respectively schematic diagrams illustrating a half tone mask having a multi semi-transmission part according to still another exemplary embodiment of the present invention.
Figure 16:
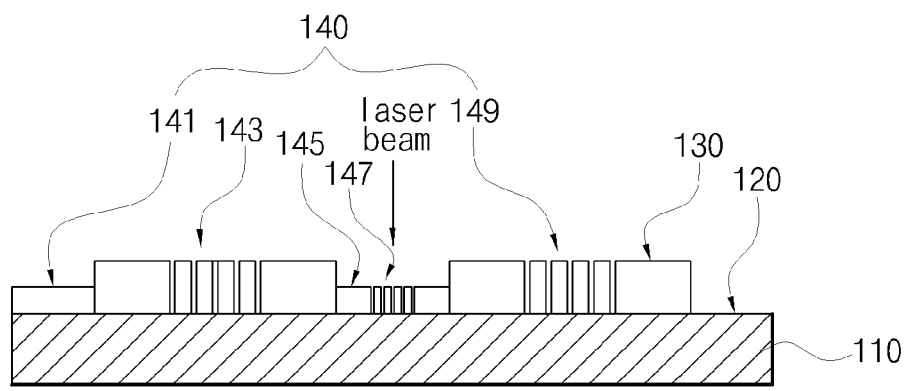
Figure 17:
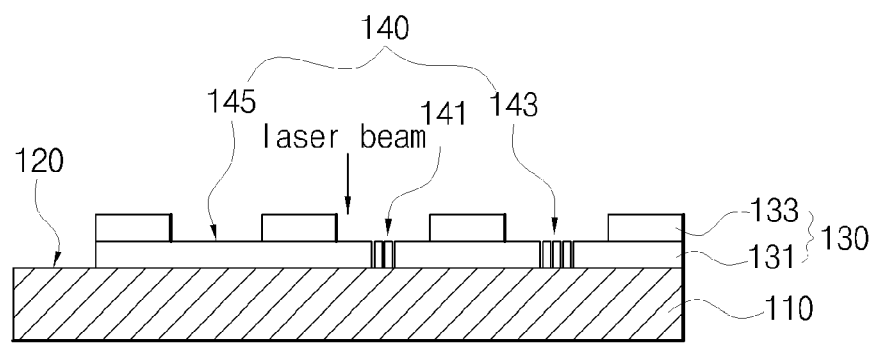

Referring to FIGS. 15 to 17, the half tone mask having the multi semi-transmission part includes the transparent substrate 110, the light shielding part 130, the light transmission part 120 and a plurality of semi-transmission parts 140.

The transparent substrate 110 is usually made of quartz (Qz), but not limited thereto. The transparent substrate 110 may be usually made of transparent material that can transmit light. The light shielding part 130 and the light transmission part 120 are formed by patterning a light-shielding material film deposited on the transparent substrate 110.

In other words, the light transmission part 120 for transmitting the light is a part of the transparent substrate 110 exposed by the patterning. The light shielding part 130 for shielding the light is a remaining part of the semi-transmission material film 120 and the light-shielding material film 130 after the patterning.

The light-shielding material film is formed of any one of Cr or CrxOy or the mixed material thereof. The light-shielding material film may be made of any one of all material that can shield the light.

On the other words, two or more of the semi-transmission parts 140 having different light transmission, which pass through the light with the predetermined wavelength band irradiated on the transparent substrate 110, are formed. The semi-transmission part 140 includes a slit type semi-transmission part formed by irradiating the laser beam, and a deposition type semi-transmission part formed by depositing the semi-transmission materials. Accordingly, the semi-transmission part 140 may be only formed by the slit type semi-transmission part, the deposition type semi-transmission part, and combination thereof.

In FIG. 15, the reference number "141" indicates "slit type semi-transmission part," and the reference number "143" indicates "deposition type semi-transmission part." In FIG. 16, the reference numbers "141", "147" and "149" indicate "slit type semi-transmission part", and the reference numbers "141" and "145" indicate "deposition type semi-transmission part". In FIG. 17, the reference numbers "141" and "143" indicate "slit type semi-transmission part", and the reference numbers "145" indicates "deposition type semi-transmission part."

According to still another of the present invention, the semi-transmission part 140 is formed to be multiple, the multi semi-transmission parts 140 have the light transmissions that are different from each other.

The light transmission of the deposition type light transmission parts of at least two or more of the semi-transmission parts 140 can be controlled according to the chemical composition or thickness of the semi-transmission material film.

The semi-transmission material may include Cr, Si, Mo, Ta, Ti and Al as major elements, and be mixed complex of at least two or more of major elements consisting of Cr, Si, Mo, Ta, Ti, Al or an additive of at least one elements selected from $Co_x$, $O_x$ and $N_x$, where x is a natural number that is changed according to the major element.

The composition of the semi-transmission part 130 can be variously made, if it passes through only one part of the irradiation light having the predetermined wavelength band. For example, the semi-transmission part 130 may be formed of any one of $Cr_xO_y$, $Cr_xCO_y$, $Cr_xO_yN_z$, $Si_xO_y$, $Si_xO_yN_z$, $Si_xCO_y$, $Si_xCO_yN_z$, $Mo_xSi_y$, $Mo_xO_y$, $Mo_xO_yN_z$, $Mo_xCO_y$, $Mo_xO_yN_z$, $Mo_xSi_yO_z$, $Mo_xSi_yO_zN$ $Mo_xSi_yCO_zN$, $Mo_xSi_yCO_z$, $Ta_xO_y$, $Ta_xO_yN_z$, $Ta_xCO_y$, $Ta_xO_yN_z$, $Al_xO_y$, $Al_xCO_y$, $Al_xO_yN_z$, $Al_xCO_yN_z$, $Ti_xO_y$, $Ti_xO_yN_z$, $Ti_xCO_y$, or the combination thereof. More preferably, the semi-transmission part 130 is formed of chromium including oxygen ($Cr_xO_y$), where x, y and z is a natural number, and means the number of chemical hydrators.

The slit type semi-transmission parts of the semi-transmission parts may be formed on a predetermined part of the light shielding part 130 or the deposition type semi-transmission part. In other words, the slit type semi-transmission parts are formed by irradiating the laser beam on the light shielding part 130 or the deposition type semi-transmission part. The light transmission of the formed slit type semi-transmission parts can be controlled according to width and height of the slit.

The slit type semi-transmission part and deposition type semi-transmission part pass through a part of the irradiated light and the light irradiated by the light transmissions that are different from each other.

The irradiated light is not limited separately, because the wavelength band of the light can be changed according to an exposure system. However, the irradiated light usually uses the wavelength band of 300 nm~440 nm. It is desirable that the semi-transmission part 131 can transmit a part of the irradiated light, preferably 10%~90% of the irradiated light, but not limited thereto.

Figure 18:
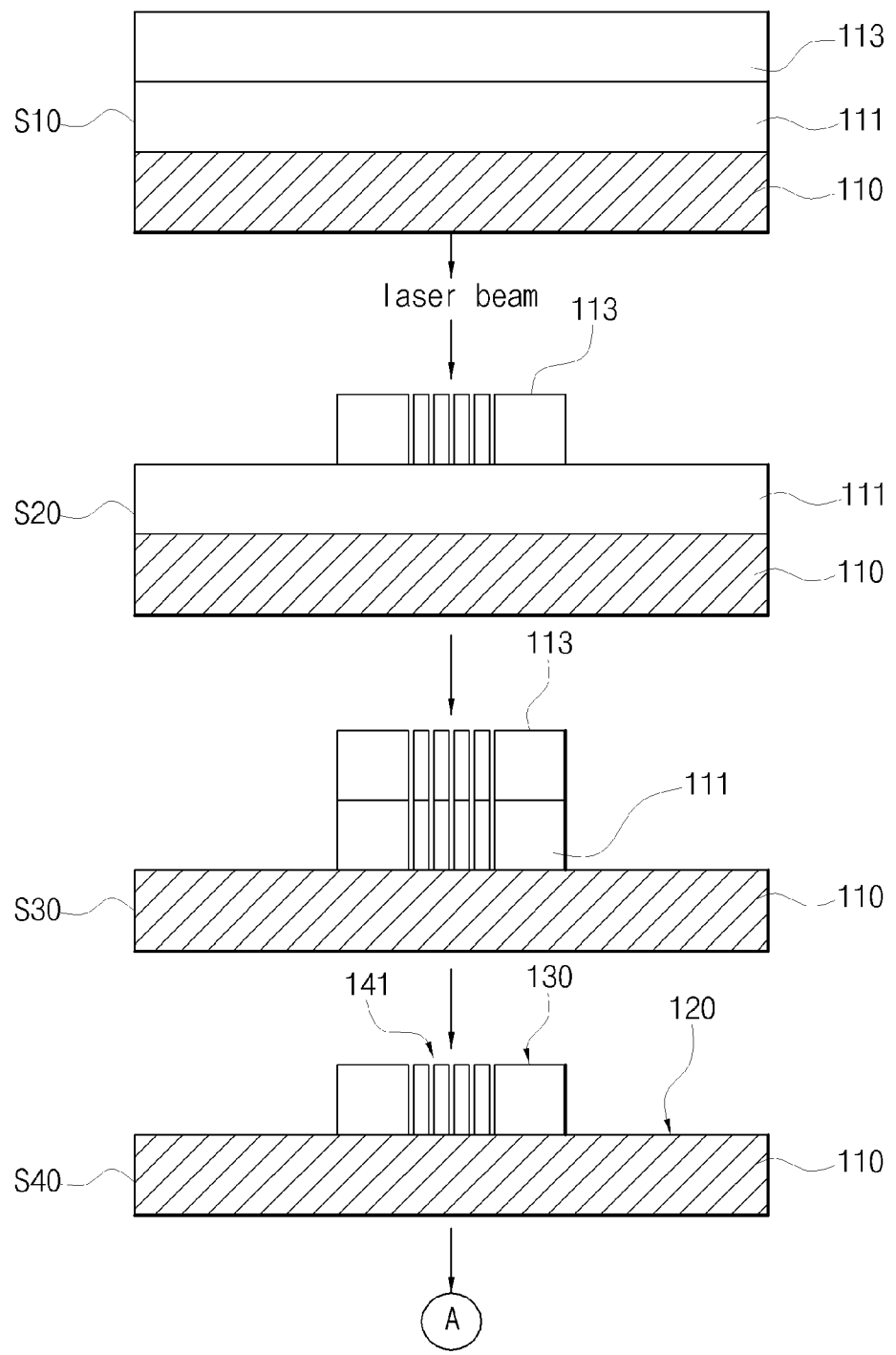
FIGS. 18 to 20 are respectively flow charts illustrating a first process of manufacturing a half tone mask having a multi semi-transmission part according to still another exemplary embodiment of the present invention.
Figure 19:
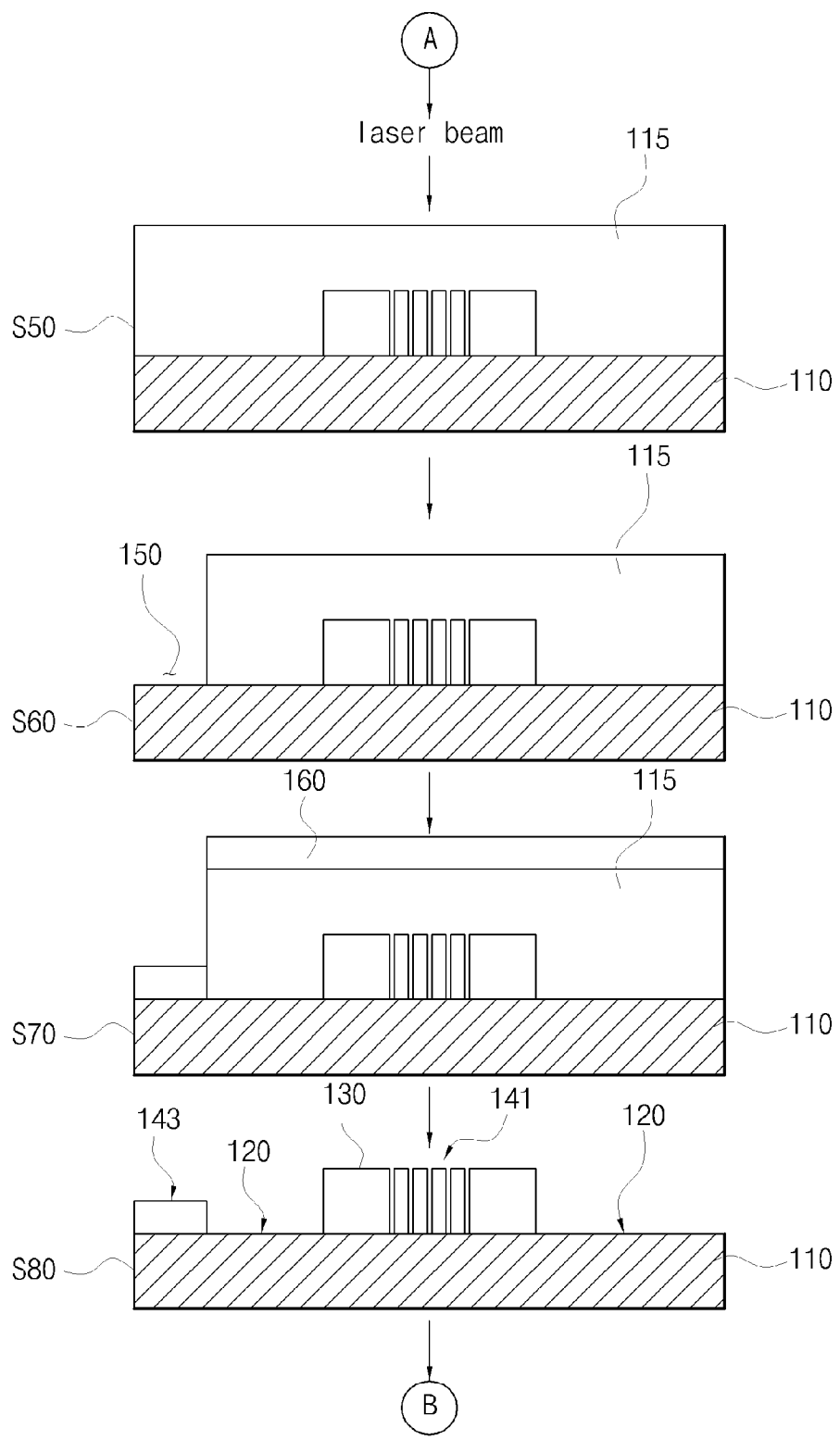
Figure 20:
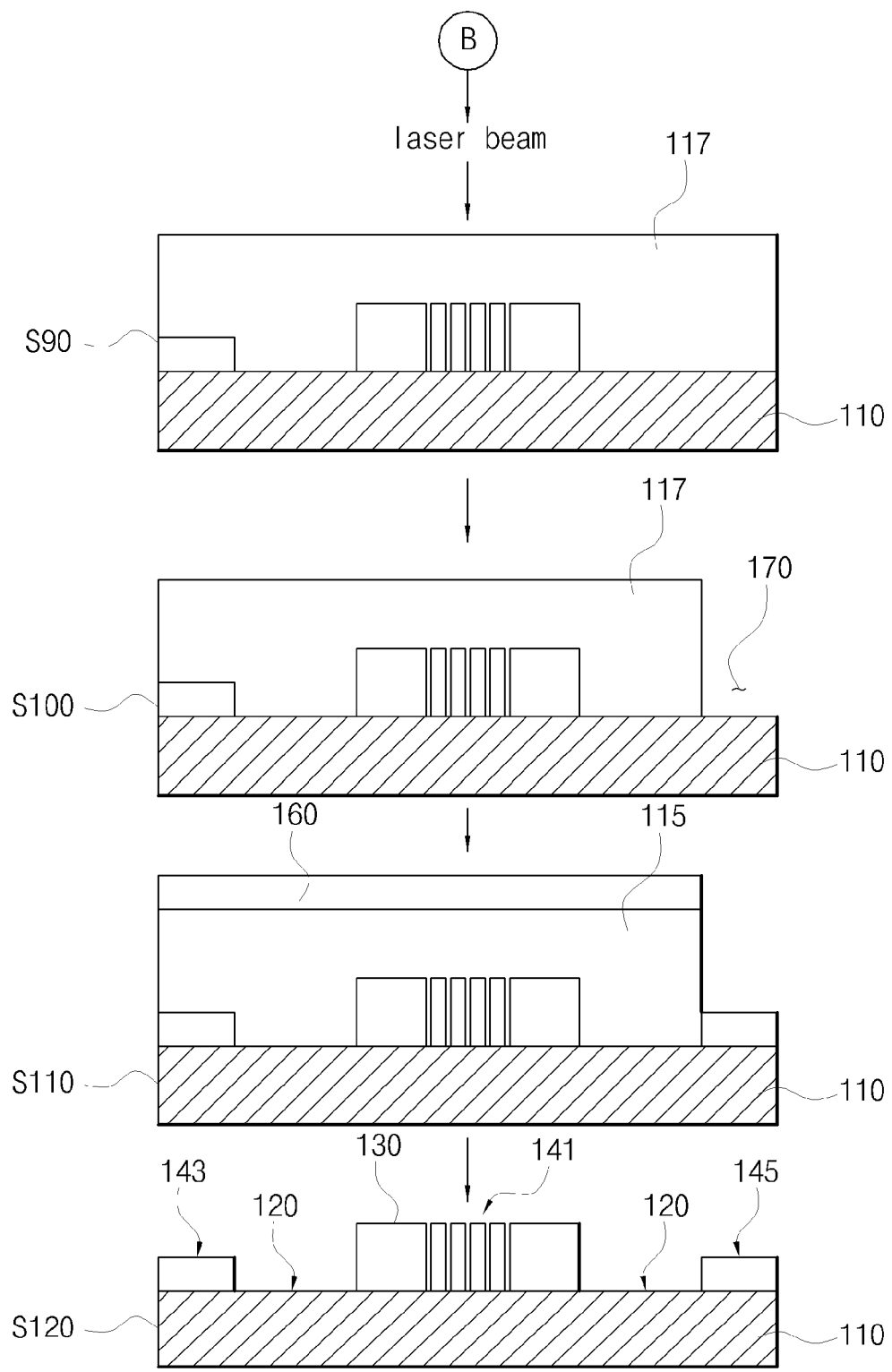

Next, a first process of manufacturing a half tone mask having multi semi-transmission parts according to still another of the present invention will be explained with reference to FIGS. 18 to 20.

First, the light-shielding material film 111 and the first positive photoresist 113 are sequentially formed on the transparent substrate 110 made of quartz (Qz), and the laser beam is irradiated to the upper surface of the first positive photoresist 113 so as to draw a desired pattern on the first positive photoresist 113 S10.

The light-shielding material film 120 is formed of any one of Cr or CrxOy, or the mixed material thereof, preferably light shielding material, where x is a natural number that can be changed according to the combination of the elements.

A portion of the first positive photoresist 113 where the laser beam is irradiated is removed by the development process S20. When the laser beam is irradiated, at least one slit shapes may be formed on the first positive photoresist 113.

A portion of the light-shielding material film 111 exposed outwardly by the development process is removed by the etching process S30.

The first positive photoresist 113 is perfectly removed S40.

A portion of the light-shielding material film 111, where the first positive photoresist 113 is removed, becomes the light transmission part 120 for transmitting completely the irradiation light having the predetermined wavelength band. A portion of the light-shielding material film 111, where the first positive photoresist 113 is not removed, becomes the light shielding part 130 for shielding completely the irradiation light having the predetermined wavelength band. In the light shielding material film 111, a patterning portion of a slit shape becomes the slit type semi-transmission part 141 for passing through a part of the irradiated light. The light transmission part 120, the light shielding part 125 and slit type semi-transmission part 141 are formed on the light shielding material film 111 in the photolithography process.

Next, after forming the slit type semi-transmission part 141, at least one deposition type semi-transmission part is formed by depositing the semi-transmission material on the semi-transmission part 120. The deposition type semi-transmission part passes through a part of the irradiated light having the light transmission different from slit type semi-transmission part 141.

To form the deposition type semi-transmission part having the light transmission different from the slit type semi-transmission part 141, the second photoresist 115 is coated on the light transmission part 120, the slit type semi-transmission part 14 and the light shielding part 130 S50.

Next, the laser beam is irradiated on the upper surface of the second photoresist 115 so as to draw a desired pattern on the second photoresist 115. The irradiated region of the second photoresist 115 is removed by the development process S60. Then, the space part 150, in which the deposition type semi-transmission part 143 will be formed, is formed.

In other words, the second photoresist 115 is exposed and developed so as to expose the light transmission part 120 that corresponds to a region where the deposition type semi-transmission part 143 will be formed.

As described above, after exposing and developing the second photoresist 115, the semi-transmission material is formed on the upper surface of the exposed light transmission part 120, i.e., the upper surface of the space part 150, where the deposition type semi-transmission part 143 will be formed, and the upper surface of the second photoresist 115 S70.

In other words, the semi-transmission material film 160, which transmits a part of the light having the predetermined wavelength band irradiated on the space part 150 and the second photoresist 115. The semi-transmission material film 160, is formed by the sputtering coating process. The semi-transmission material film 160 is consisted of the chemical composition that can pass through the part of the light having the predetermined wavelength band S70.

Next, the second photoresist 115 and the semi-transmission material film 160 deposited on an upper surface of the third photoresist 165 are removed by a lift-off method. The semi-transmission material film 160 remains only on the upper surface of the exposed light transmission part and the space part 150 where the deposition type semi-transmission part 143 will be formed. The remaining semi-transmission material film 160 is the deposition type semi-transmission part 143.

The light transmission of the deposition type semi-transmission part 143 can be controlled according to the composition rate that can pass through only the part of the irradiated light having the predetermined wavelength band and its thickness.

The deposition type semi-transmission part 143 is formed through the steps S50~S80. In other words, a separate semi-transmission part having the light transmission different from the basic semi-transmission part 131 can be formed.

If the deposition type semi-transmission part forms additionally, the steps S50~80 are repeated. However, since the additional deposition type semi-transmission part is formed on the light transmission part 120 where the transparent substrate 110 is exposed, the exposed region and the developed region of the photoresist are changed. In other words, to form additionally the deposition type semi-transmission part, the steps S50~S80 are repeated. Consequently, the semi-transmission part is formed to be multiple, if necessary.

For convenient explanation, a process of forming an additional deposition type semi-transmission part 145 will be briefly explained.

When the slit type semi-transmission part 141 and the deposition type semi-transmission part 143 have been formed, the third photoresist 117 is formed on two semi-transmission parts 141 and 143, the light shielding part 130 and the light transmission part 120 with coating S90. Then, the laser beam is irradiated so as to expose a desired part of the third photoresist 117, and the exposed part is developed S100. As a result, a space part 170, where the deposition type semi-transmission part 145 will be formed, is formed.

After forming the space part 170, the semi-transmission material film 160 is deposited on the upper surface of the third photoresist 117 and the space part 170.

Next, the semi-transmission material film 160 is deposited to transmit a part of the light having the predetermined wavelength band irradiated on the space part 170 and the third photoresist 117 S110. The semi-transmission material film 160 is formed by the sputtering coating process. The semi-transmission material film 160 is consisted of the chemical composition that can pass through only a part of the irradiated light having the predetermined wavelength band.

Next, the third photoresist 117 and the semi-transmission material film 160 deposited on an upper surface of the third photoresist 117 are removed by the lift-off method S120. The semi-transmission material film 160 remains only on the upper surface of the exposed light transmission part and the space part 170 where the deposition type semi-transmission part 145 will be formed. The remaining semi-transmission material film 160 is the additional deposition type semi-transmission part 145.

The light transmission of the additional deposition type semi-transmission part 145 can be controlled according to the composition rate that can pass through only the part of the irradiated light having the predetermined wavelength band and its thickness.

As described above, the additional deposition type semi-transmission part 145 is formed through the steps S90~S120. In other words, the additional deposition type semi-transmission part 145 having the light transmission different from the slit type semi-transmission part 141 and the deposition type semi-transmission part 143 is formed.

Next, a second process of manufacturing a half tone mask having multi semi-transmission parts according to still another embodiment of the present invention will be explained with reference to FIGS. 21 to 26.

First, the light-shielding material film 111 for shielding the light irradiated on the transparent substrate 110 made of quartz (Qz) and the first positive photoresist 113 are sequentially formed, and the laser beam is irradiated to the upper surface of the first positive photoresist 113 so as to draw a desired pattern on the first positive photoresist 113 S10.

A portion of the first positive photoresist 113 where the laser beam is irradiated is removed by the development process S20. A portion of the light-shielding material film 120 exposed outwardly by removing the first positive photoresist 141 is removed by the etching process S30.

The first positive photoresist 113 is perfectly removed S40. A portion of the light-shielding material film 111, where the first positive photoresist 113 is removed, becomes the light transmission part 120 for transmitting completely the irradiation light having the predetermined wavelength band. A portion of the light-shielding material film 120, where the first positive photoresist 113 is not removed, becomes the light shielding part 130 for shielding completely the irradiation light having the predetermined wavelength band. The light transmission part 120 and the light shielding part 130 are formed on the light shielding material film 111 in the photolithography process.

Next, the semi-transmission part 120 for transmitting only one part of the irradiation light having the predetermined wavelength band is formed. This will be explained in detail below.

A semi-transmission material film 150 for transmitting only a part of the light of the predetermined wavelength band irradiated on the light transmission part 120 and the light shielding part 130 is formed by the deposition process S50. The semi-transmission material film 150 is formed by a sputtering coating process. The semi-transmission material film 150 is consisted of chemical composition that can pass through only a part of the irradiated light having the predetermined wavelength band.

After forming the semi-transmission material film 150 in the step S50, a second positive photoresist 155 is coated on the semi-transmission material film 150 S60. In the step S60, the second positive photoresist 145 is exposed and drawn by irradiating the laser beam so that a predetermined portion of the semi-transmission material film 150 is exposed to the outside. The portion of second positive photoresist 145 irradiated by the laser beam is developed and removed S70.

The portion of the semi-transmission material film 150 exposed to the outside is an upper surface of the transparent substrate 110, where the semi-transmission material film 150 is deposited, except a portion where the semi-transmission part 145 will be formed.

Next, the exposed portion of the semi-transmission material film 150 performs a wet etching so as to expose a predetermined portion of the transparent substrate 110 to the outside S80. The second positive photoresist 155 existing on semi-transmission material film 150, where the wet etching is not performed, is removed S90. The semi-transmission material film 150 remains on a part of each upper surface of the light shielding part 130 and the transparent substrate 110. The semi-transmission material film 150 remaining on the part of the upper surface of the transparent substrate 110 is the deposition type semi-transmission part 145.

In other words, the chemical composition that can transmit a part of the light having the predetermined wavelength band irradiated on a portion of the light transmission part 121 is coated on the deposition type semi-transmission part 145. The deposition type semi-transmission part 145 transmits only a part of the irradiated light having the predetermined wavelength band. The light transmission of the deposition type semi-transmission part 145 can be controlled according to a composition rate of the chemical composition and its thickness that can transmit only a part of the irradiated light having the predetermined wavelength band.

As described above, if the deposition type semi-transmission part 145 is formed through the steps S10~S80, the light shielding part 130 includes the semi-transmission material film 150. When the deposition type semi-transmission part 145 is formed, the case where the light shielding part 130 does not include the semi-transmission material film 150 without including will be explained with reference to FIGS. 25 and 26.

Figure 21:
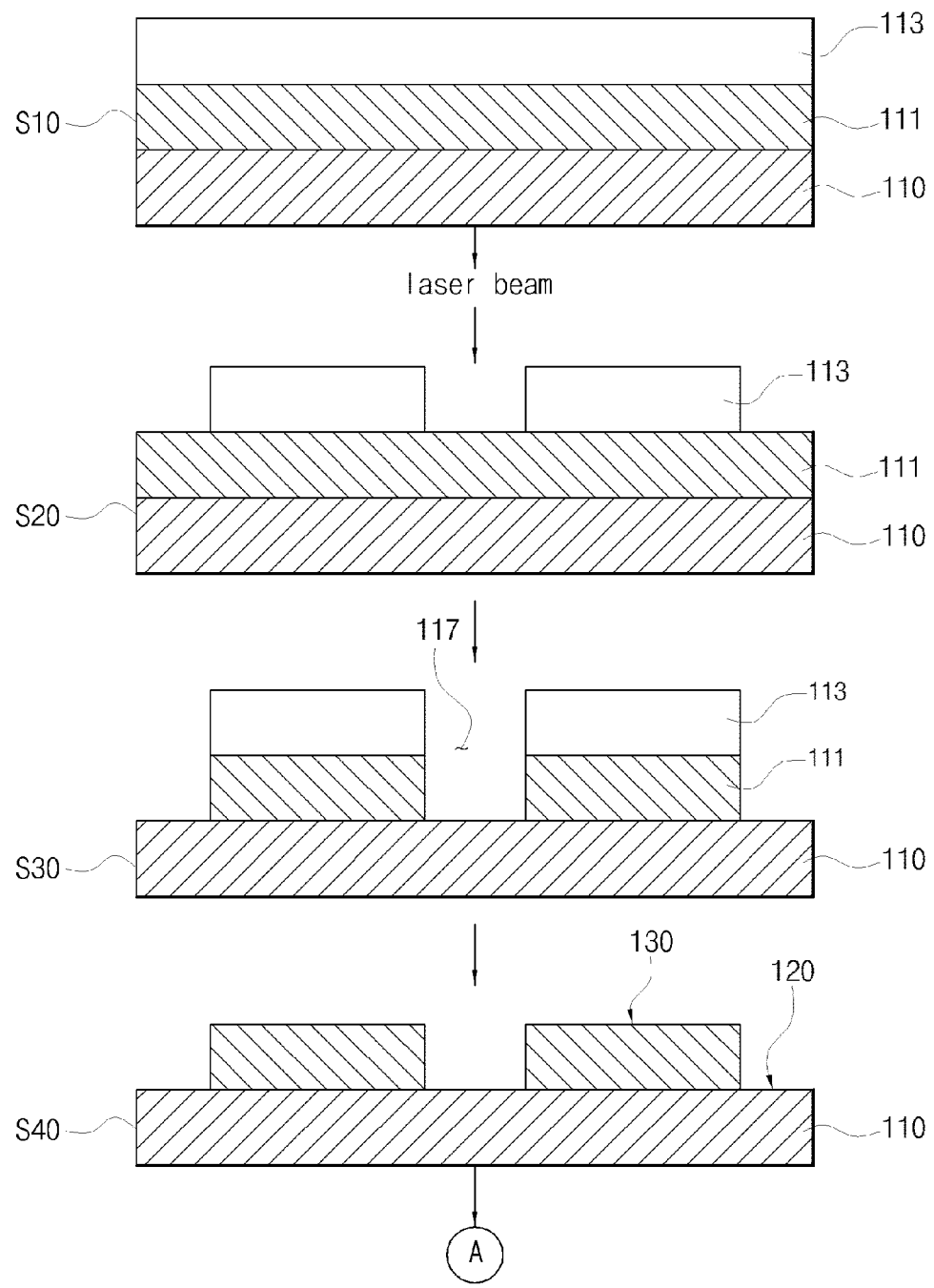
FIGS. 21 to 26 are respectively flow charts illustrating a second process of manufacturing the half tone mask having the multi semi-transmission part according to still another exemplary embodiment of the present invention.
Figure 22:
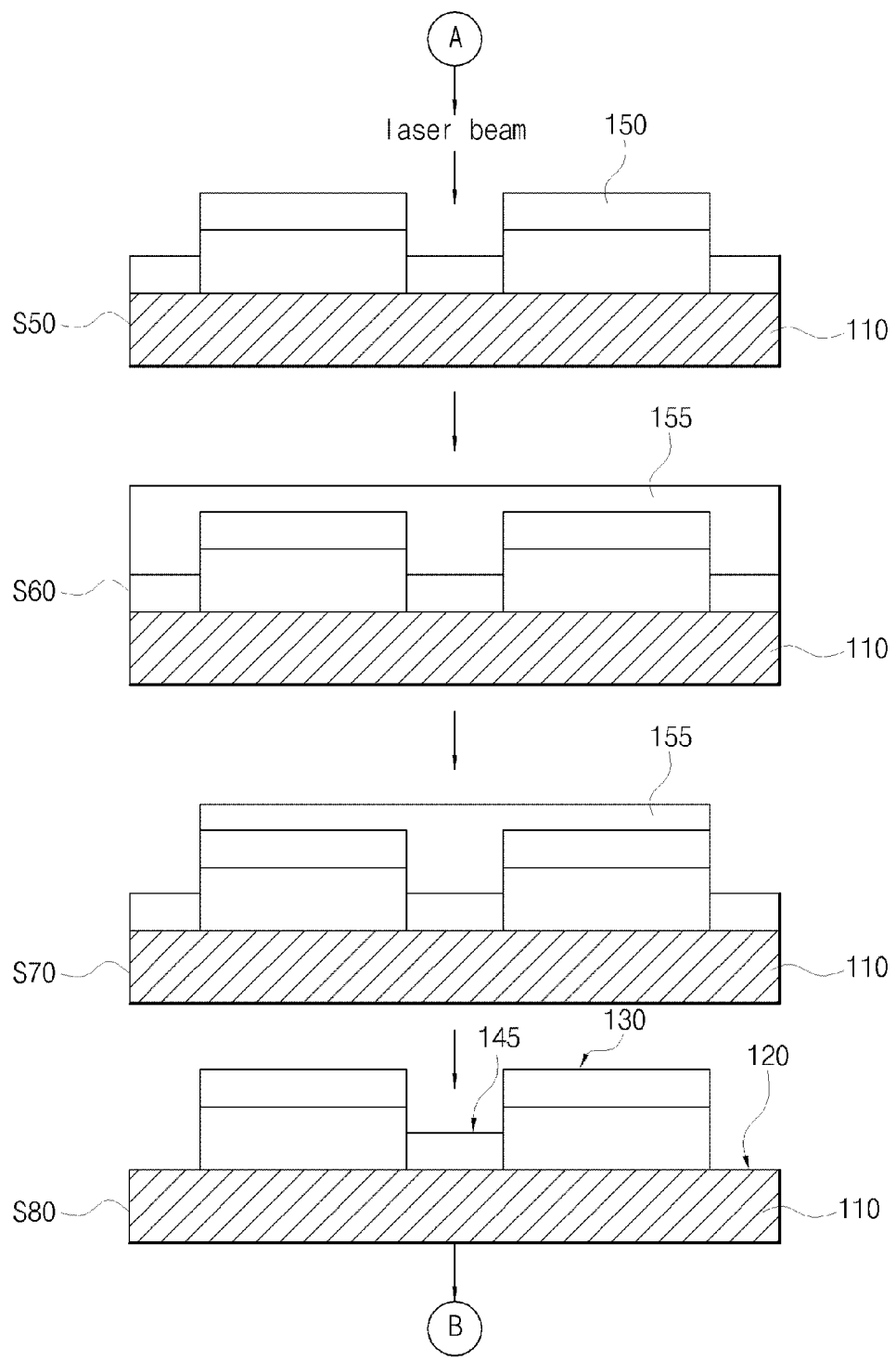

Since the steps S10~S40 are the same as those of FIG. 21, the explanation will be omitted. The process of forming the deposition type semi-transmission part 145 will be explained with reference to FIG. 26.

Figure 25:
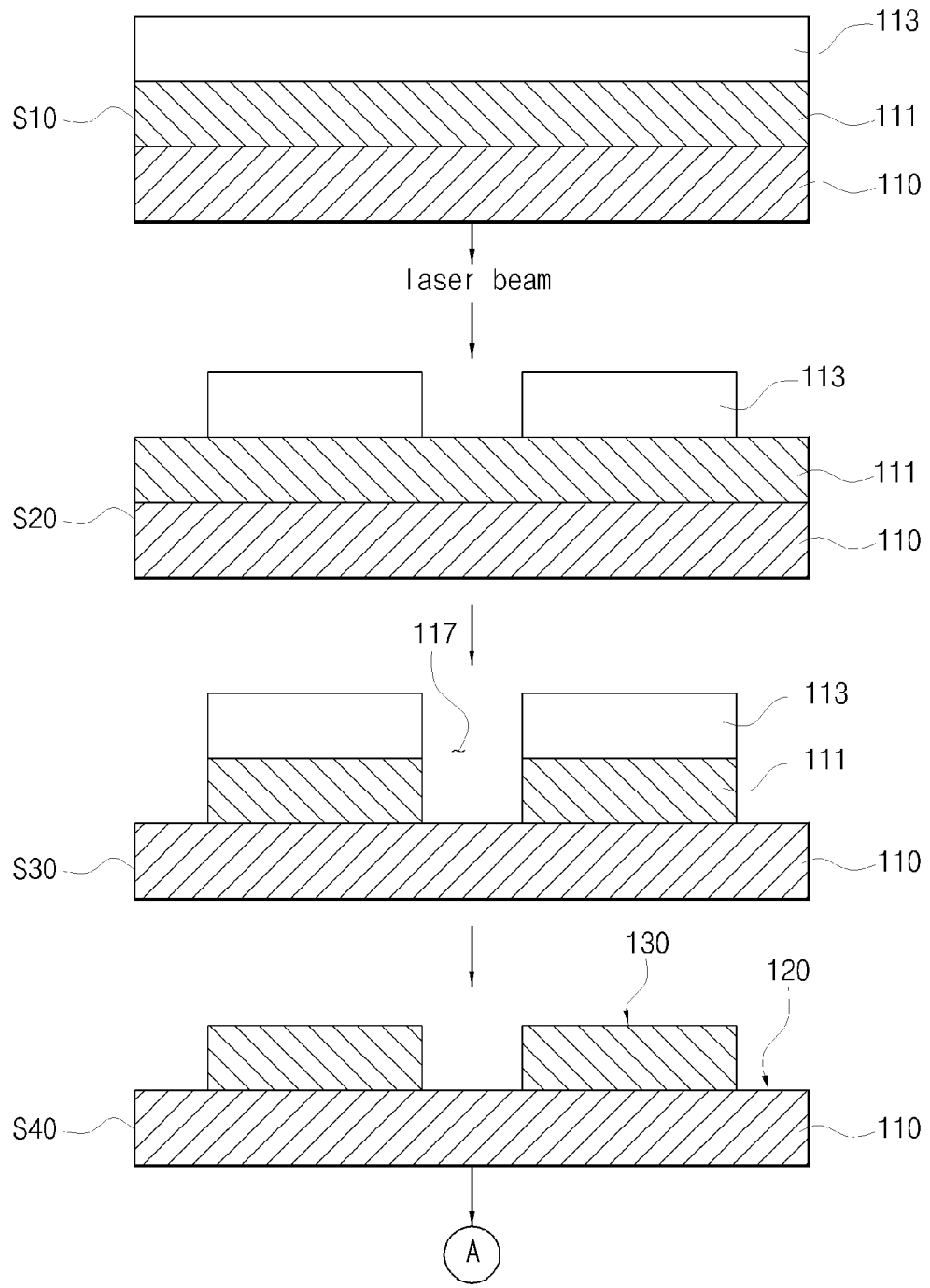
Figure 26:
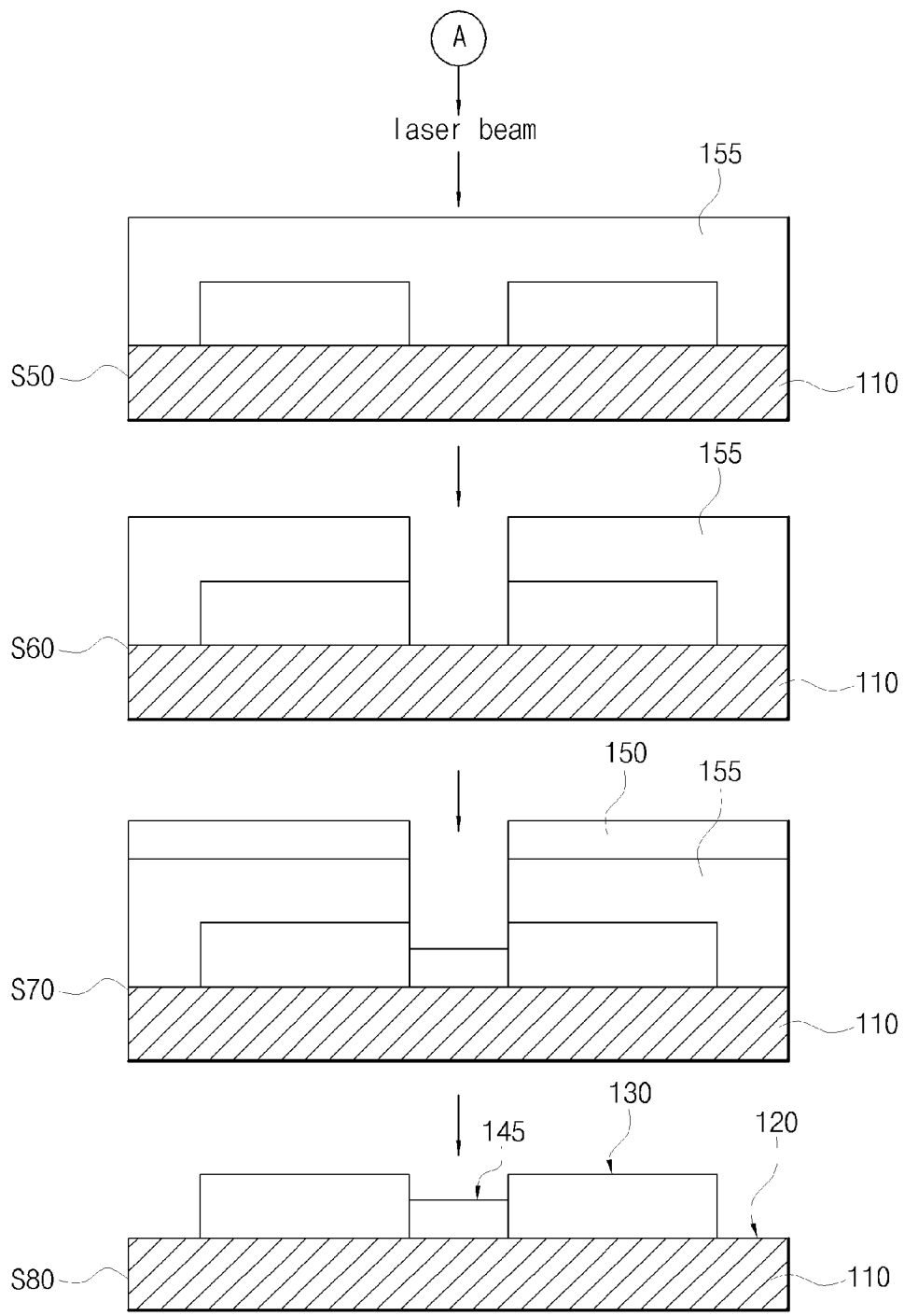

Referring again to the step S40 of FIG. 25, to form the deposition type semi-transmission part after removing perfectly the first photoresist 113, the second photoresist 155 is coated on the light transmission part 120 and the light shielding part 130 S50.

Next, the laser beam is irradiated on the upper surface of the second photoresist 155 so as to draw a desired pattern on the second photoresist 155. The irradiated region of the second photoresist 155 is removed by the development process S60. Then, the space part, in which the deposition type semi-transmission part 145 will be formed, is formed.

In other words, the second photoresist 155 is exposed and developed so as to expose the light transmission part 120 that corresponds to a region where the deposition type semi-transmission part 145 will be formed.

As described above, after exposing and developing the second photoresist 155, the semi-transmission material is formed on the upper surface of the exposed light transmission part 120, i.e., the upper surface of the space part 161, where the deposition type semi-transmission part 145 will be formed, and the upper surface of the second photoresist 155 S70.

In other words, the semi-transmission material film 150, which transmits a part of the light having the predetermined wavelength band irradiated on the space part and the second photoresist 155, is formed by the deposition process. The semi-transmission material film 150 is formed by the sputtering coating process. The semi-transmission material film 150 is consisted of the chemical composition that can pass through the part of the light having the predetermined wavelength band S70.

Next, the second photoresist 155 and the semi-transmission material film 150 deposited on an upper surface of the third photoresist 165 are removed by a lift-off method. The semi-transmission material film 150 remains only on the upper surface of the exposed light transmission part and the space part where the deposition type semi-transmission part 145 will be formed. The remaining semi-transmission material film 150 is the deposition type semi-transmission part 145.

The light transmission of the deposition type semi-transmission part 145 can be controlled according to the composition rate that can pass through only the part of the irradiated light having the predetermined wavelength band and its thickness.

As describe above, if the deposition type semi-transmission part 145 is formed through FIGS. 21, 22, 25 and 26, at least one slit type semi-transmission part having the light transmission different from the deposition type semi-transmission part 145 is formed. The slit type semi-transmission part may be formed by irradiating the laser beam on the deposition type semi-transmission part 145 or the light shielding part 130.

Figure 23:
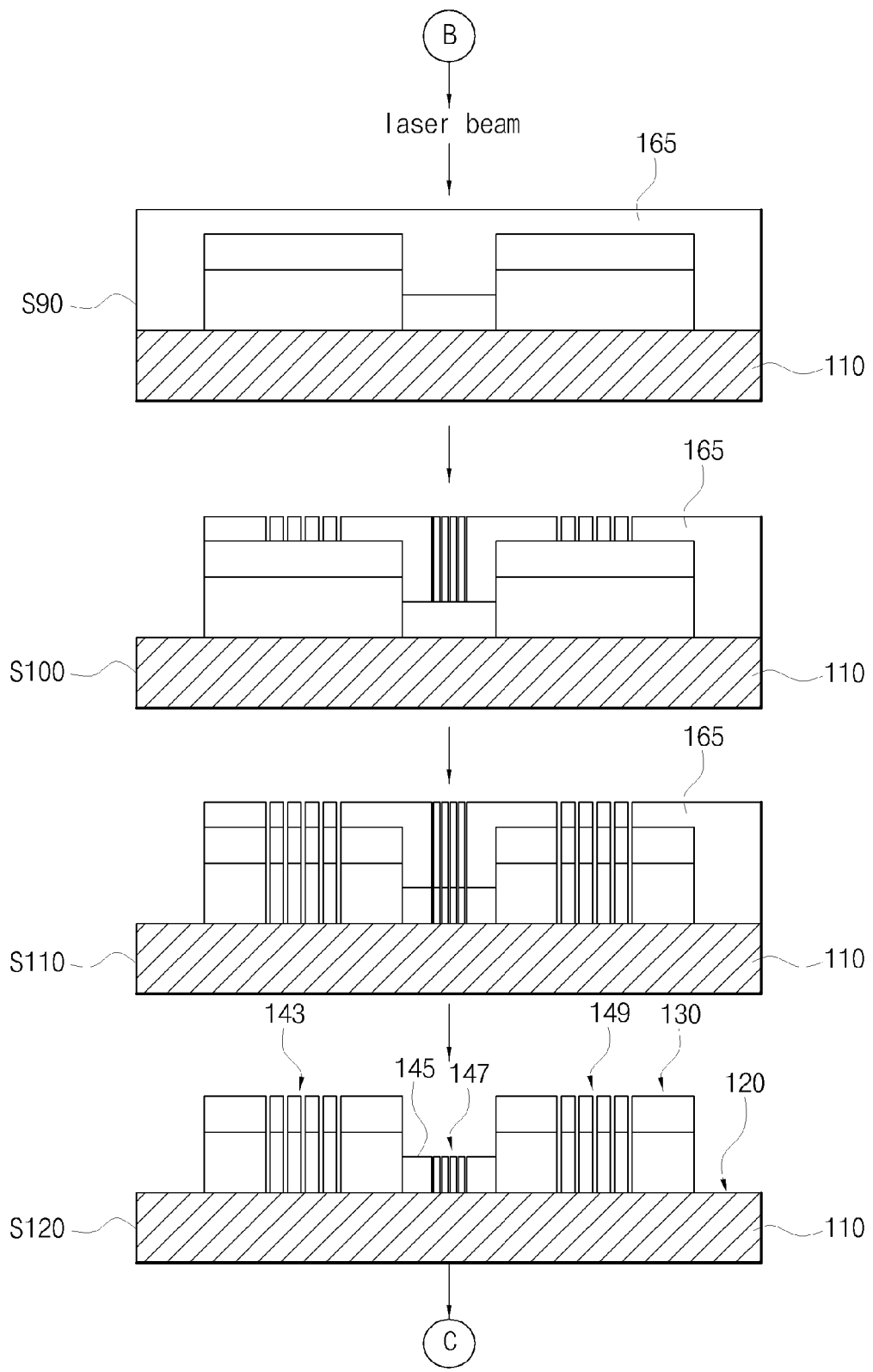
Figure 24:
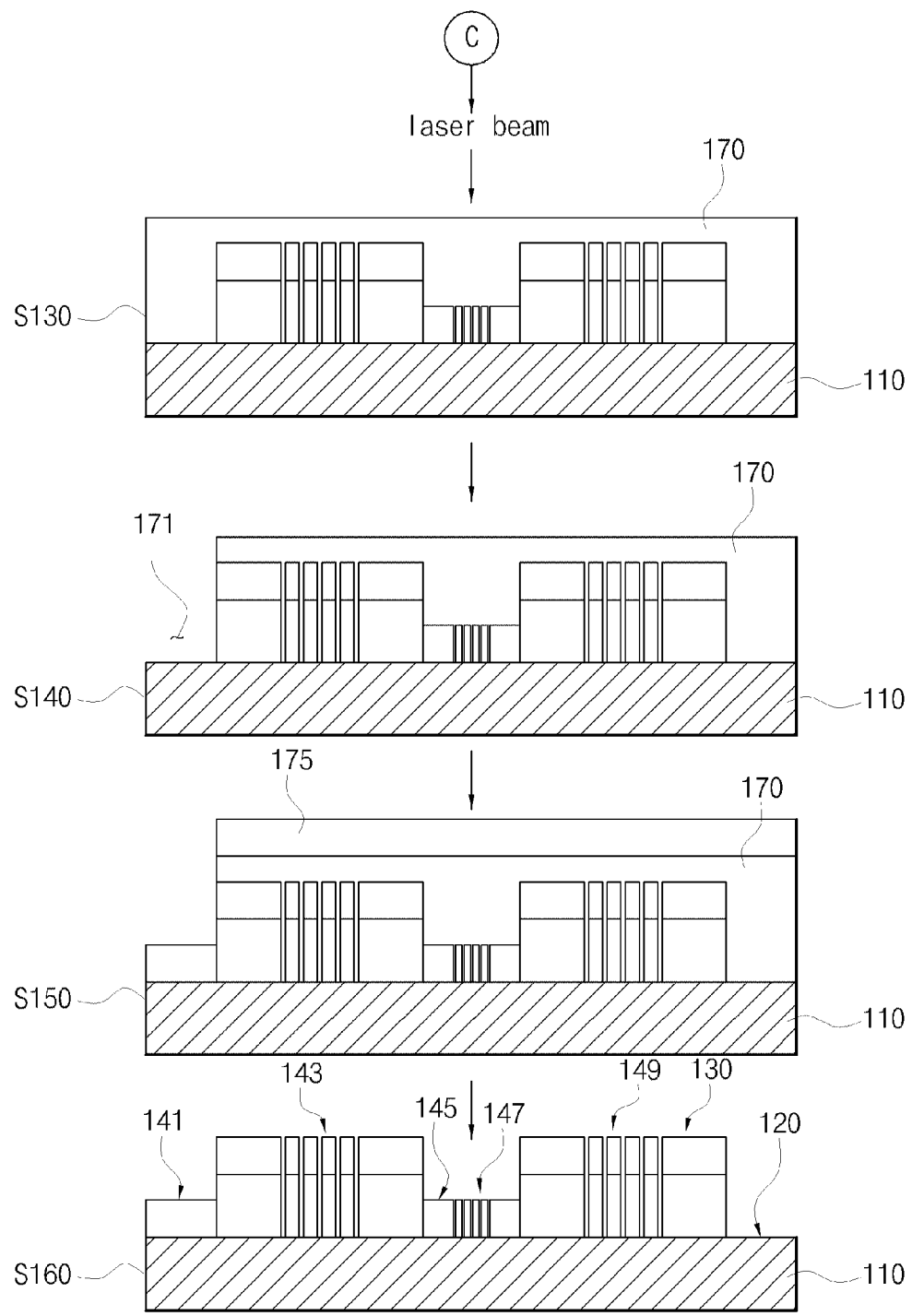

Referring to FIGS. 23 and 24, a process of forming the slit type semi-transmission part will be explained. The process, which will be explained below, follows the step S80 of FIG. 22, but may be processed after the step S80 of FIG. 26.

The third photoresist 165 is formed on the already formed deposition type semi-transmission part 145, the light shielding part 130 and the light transmission part 120.

Next, the laser beam is irradiated on the upper surface of the third photoresist 165 so as to draw a desired pattern on the third photoresist 165.

The irradiated region of the third photoresist 165 is removed by the development process. When the laser beam is irradiated, at least one slit shape may be formed on the third photoresist 165. Accordingly, if the third photoresist 165 where the laser beam is irradiated is developed, at least one slit space parts may be formed.

Each exposed region of the light shielding part 130 and the deposition type semi-transmission part 145 is removed by the etching process S110. Then, the third photoresist 165 is removed S120.

The slit type semi-transmission is formed on at least one of the light shielding part 130 and the deposition type semi-transmission part 145. In FIG. 10c, it is exemplified that the slit type semi-transmission parts 143, 147 and 149 are formed on both the light shielding part 130 and the deposition type semi-transmission part 145.

As described above, the slit type semi-transmission parts 143, 147 and 149 have the light transmission different from the light shielding part 130. The light transmission of the slit type semi-transmission parts 143, 147 and 149 is also different from each other. The light transmission of the slit type semi-transmission parts 143, 147 and 149 can be changed according to width of the slit, the number of the slits, and a space of the slit (deposition type semi-transmission part or light shielding part).

Meanwhile, after forming the slit type semi-transmission parts 143, 147 and 149, at least one of the deposition type semi-transmission parts may be additionally formed by depositing the semi-transmission material on the light transmission part 120. The additional deposition type semi-transmission part passes through a part of the light having the light transmission different from the slit type semi-transmission parts 143, 147 and 149 and the deposition type semi-transmission part 145.

Referring to FIG. 24, to form the additional deposition type semi-transmission part, a fourth photoresist 170 is coated on the light transmission part 120, the slit type semi-transmission part 143, 147 and 149, the deposition type semi-transmission part 145 and the light shielding part 130.

Next, the laser beam is irradiated on the upper surface of the fourth photoresist 170 so as to draw a desired pattern on the fourth photoresist 170.

The irradiated region of the fourth photoresist 170 is removed by the development process S140. The space part 171, where the additional deposition type semi-transmission part 141 will be formed, is formed.

In other words, the fourth photoresist 170 is exposed and developed so as to expose a part of the light transmission part 120 that corresponds to a region where the deposition type semi-transmission part 141 will be formed.

As described above, after exposing and developing the fourth photoresist 170, the semi-transmission material is formed on the upper surface of the exposed light transmission part 120, i.e., the upper surface of the space part 171, where the deposition type semi-transmission part 141 will be formed, and the upper surface of the fourth photoresist 170 S150.

In other words, the semi-transmission material film 170, which transmits a part of the light having the predetermined wavelength band irradiated on the space part 171 and the fourth photoresist 170, is formed. The semi-transmission material film 175, is formed by the sputtering coating process. The semi-transmission material film 175 is consisted of the chemical composition that can pass through the part of the light having the predetermined wavelength band S70.

Next, the fourth photoresist 170 and the semi-transmission material film 175 deposited on an upper surface of the fourth photoresist 170 are removed by a lift-off method. The semi-transmission material film 175 remains only on the upper surface of the exposed light transmission part and the space part 171 where the deposition type semi-transmission part 141 will be formed. The remaining semi-transmission material film 175 is the deposition type semi-transmission part 141.

The light transmission of the additional deposition type semi-transmission part 141 can be controlled according to the composition rate that can pass through only the part of the irradiated light having the predetermined wavelength band and its thickness.

The additional deposition type semi-transmission part 143 is formed through the steps S130~S160. In other words, a separate semi-transmission part having the light transmission different from the silt type semi-transmission part 143, 147 and 149 and the already formed deposition type semi-transmission part 145 can be formed.

If the deposition type semi-transmission part is additionally formed, the steps S130~160 are repeated. However, since the additional deposition type semi-transmission part is formed on the light transmission part 120 where the transparent substrate 110 is exposed, the exposed region and the developed region of the photoresist are only changed. In other words, to form additionally the deposition type semi-transmission part, the steps S130~S160 are repeated. Consequently, the semi-transmission part is formed to be multiple, if necessary.

Next, a process of manufacturing a half tone mask having a multi semi-transmission part according to still another embodiment of the present invention will be explained with reference to FIGS. 27 to 29.

Figure 27:
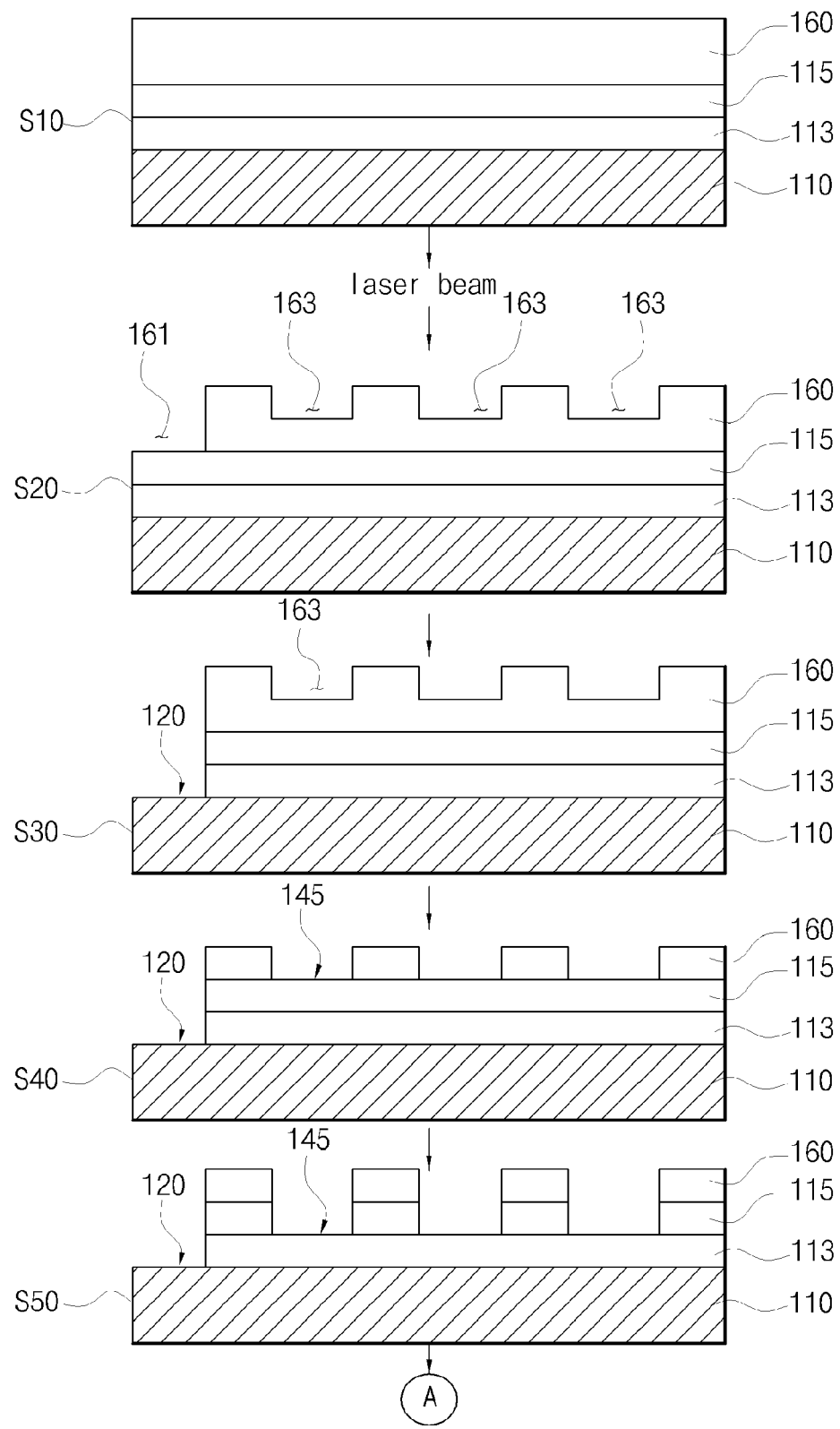
FIGS. 27 to 29 are respectively flow charts illustrating a third process of manufacturing the half tone mask having the multi semi-transmission part according to still another exemplary embodiment of the present invention.
Figure 28:
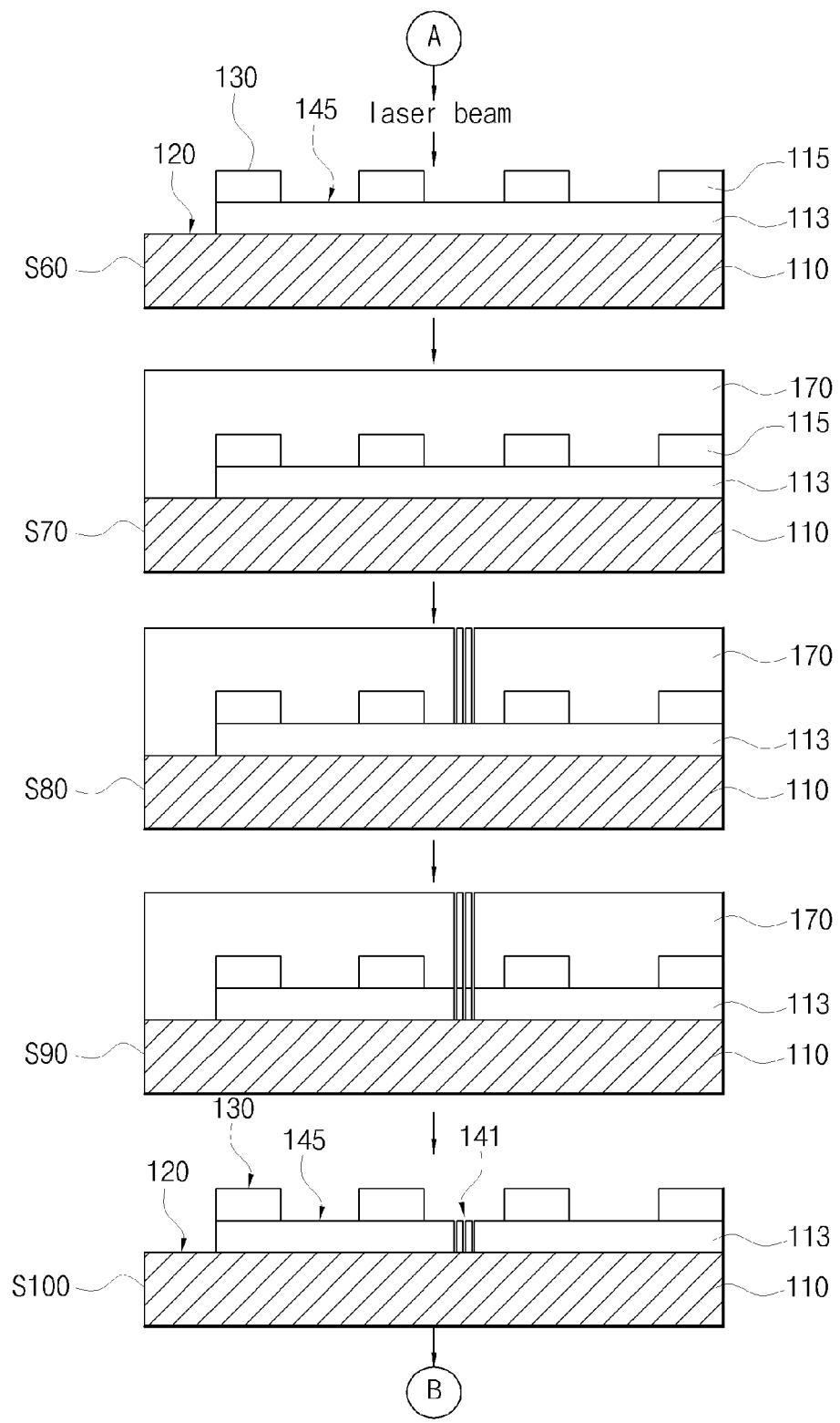
Figure 29:
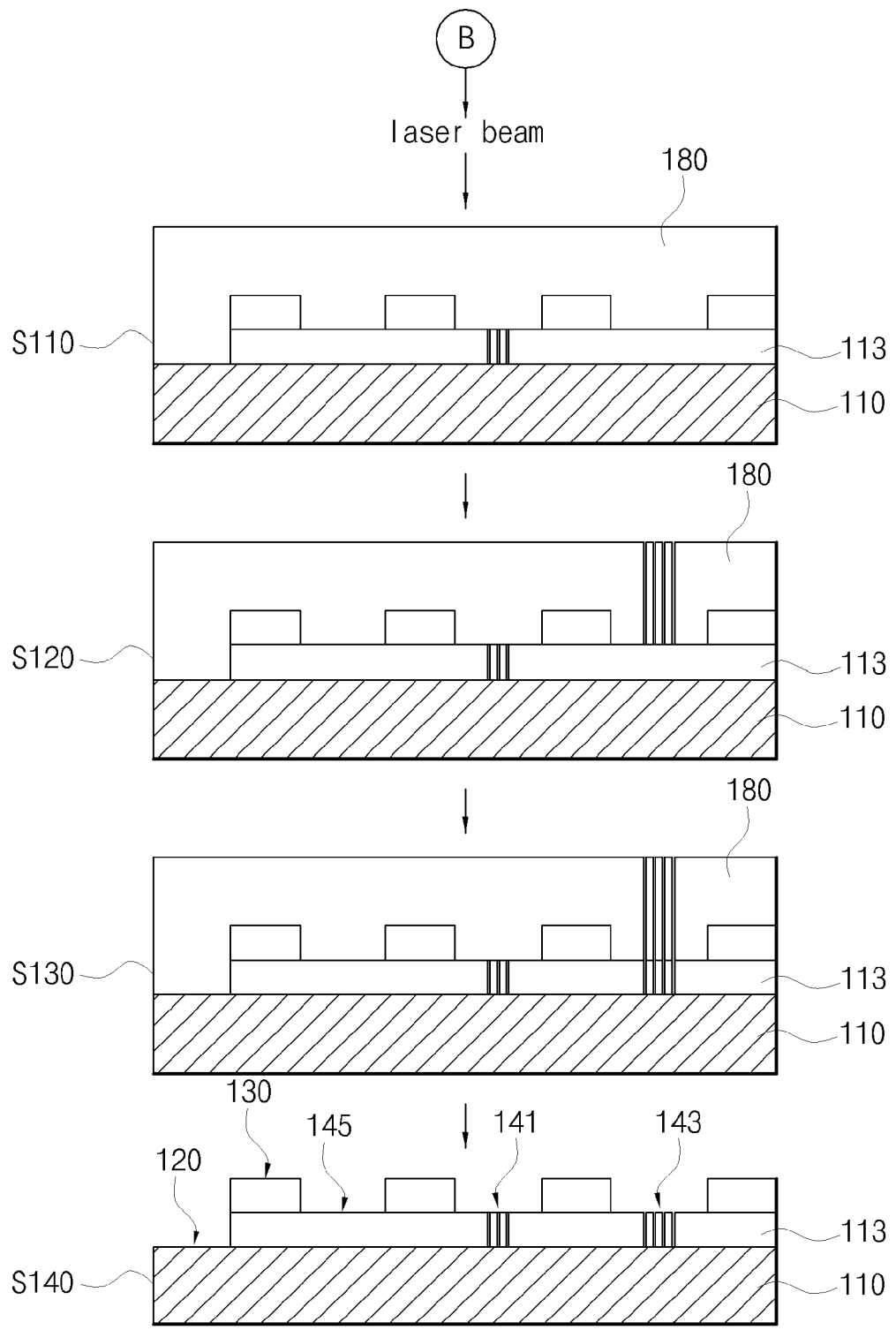

Referring to FIGS. 27 to 29, the semi-transmission material film 113 and the light-shielding material film 115 for shielding the light irradiated on the semi-transmission are sequentially formed on the transparent substrate 110 made of quartz (Qz) S10.

The semi-transmission material film 113 may include Cr, Si, Mo, Ta, Ti and Al as major elements, and be mixed complex of at least two or more of major elements consisting of Cr, Si, Mo, Ta, Ti, Al or an additive of at least one elements selected from Cox, Ox and Nx, where x is a natural number that is changed according to the major element.

Next, the laser beam is irradiated on the upper surface of the first positive photoresist 160 so as to draw the desired pattern on first positive photoresist 160.

The pattern is formed on the first positive photoresist 160 in a full exposure process and a half exposure process. In other words, the full exposure process is performed for entire thickness of the first positive photoresist 160 by receiving all of the irradiated light. The half exposure process is performed for fixed thickness of first positive photoresist 160 by receiving a part of the irradiated light.

If the exposed part of the first positive photoresist 160 is developed after performing the full exposure and half exposure processes, a full exposure region 161 and a half exposure region 163 are formed.

After the full exposure region 161 and the half exposure region 163 are formed, the light-shielding material film 115 exposed on the full exposure region 161 and the semi-transmission material film 113 existing on the lower part of the light-shielding material film 115 are sequentially etched. Then, the light transmission part 120, i.e., a portion that the transparent substrate 110 is exposed to the outside, is formed S30.

After forming the light transmission part 120 in the step S30, an ashing process is performed for the first positive photoresist 160. Then, the first positive photoresist 160 remaining on the half exposure region 163 is removed to expose the light-shielding material film 115 to the outside, and height of the first positive photoresist 160 is totally lowered.

As described above, when the light-shielding material film 115 located on the half exposure region 163 is exposed to the outside by performing the ashing process for the first positive photoresist 160, the exposed light-shielding material film 115 is partially etched so as to expose the semi-transmission material film 113 located on the lower part of the light-shielding material film 115 S50.

The exposed semi-transmission material film 113 is the deposition type semi-transmission part 145 according to a third process of the still another embodiment of the present invention. After forming the deposition type semi-transmission part 145, the first positive photoresist 160 remaining on the light-shielding material film 115 is removed. Then, the light shielding part 130 formed by depositing the semi-transmission material film 113 and the light-shielding material film 115 is formed S60.

The light transmission of the deposition type semi-transmission part 145 can be controlled according to the chemical composition that can pass through only a part of the irradiated light having the predetermined wavelength band and its thickness.

The deposition type semi-transmission part 145 may include Cr, Si, Mo, Ta, Ti and Al as major elements, and be mixed complex of at least two or more of major elements consisting of Cr, Si, Mo, Ta, Ti, Al or an additive of at least one elements selected from Cox, Ox and Nx, where x is a natural number that is changed according to the major element.

As described above, after forming the deposition type semi-transmission part 145, at least one slit type semi-transmission parts having the light transmission different from the deposition type semi-transmission part 145 may be formed.

Next, a process of forming a slit type semi-transmission part on the deposition type semi-transmission part 145 will be explained.

First, the second positive photoresist 170 is formed on the already formed deposition type semi-transmission part 145, the light shielding part 130 where the semi-transmission material film 113 and the light shielding material film 115 are deposited, and the light transmission part 120.

Next, the laser beam is irradiated on the upper surface of the second photoresist 170 so as to draw a desired pattern on the second photoresist 170.

The irradiated region of the third photoresist 165 is removed by the development process. When the laser beam is irradiated, at least one slit shape may be formed on the second photoresist 170. Accordingly, if the second photoresist 170 where the laser beam is irradiated is developed, at least one slit space parts may be formed S80.

Each exposed region of the light shielding part 130 and the deposition type semi-transmission part 145 is removed by the etching process S90. Then, the second photoresist 170 is removed S90.

The slit type semi-transmission part 141 is formed on at least one of the light shielding part 130 and the deposition type semi-transmission part 145. It is exemplified that the slit type semi-transmission part 141 are formed only on the deposition type semi-transmission part 145 S100.

As described above, the slit type semi-transmission part 141 has the light transmission different from the previously formed deposition type semi-transmission 145.

To form the slit type semi-transmission part having the light transmission different from the formed slit type semi-transmission 141, the steps S60~S100 are repeated.

Referring to FIG. 29, in the steps S110~S140, the additional slit type semi-transmission part 143 having the light transmission different from the deposition type semi-transmission part 140 and the slit type semi-transmission part 141 may be formed. If the additional semi-transmission part is additionally formed, the steps S80~S110 are performed.

However, since the additional slit type semi-transmission part 143 is formed on the deposition type semi-transmission part 145 or the light shielding part 130, each of which does not form the slit type semi-transmission part 141, the exposed region and the developed region of the photoresist can be changed. The additional slit type semi-transmission part 143 can have the light transmission different from the slit type semi-transmission part 141 by changing width of the slit, or the number of the slits.

INDUSTRIAL APPLICABILITY

As described above, the half tone mask having a multi semi-transmission part and a manufacturing method thereof according to the present invention generates the following effects.

First, the patterning of the plurality of layers is performed using one mask, by having at least two or more semi-transmission parts with light transmission that are different from each other, thereby allowing various flat panel display elements to be used.

Second, one mask is used in the photolithography process, thereby allowing the manufacturing process to be shorten and the cost to be reduced.

It should be understood by those of ordinary skill in the art that various replacements, modifications and changes in the form and details may be made therein without departing from the spirit and scope of the present invention as defined by the following claims. Therefore, it is to be appreciated that the above described embodiments are for purposes of illustration only and are not to be construed as limitations of the invention.

What is claimed is:

1. A half tone mask comprising:
   a transparent substrate;
   a light transmission part formed on the transparent substrate to transmit irradiation light of a predetermined wavelength band;
   a light shielding part formed on the transparent substrate to shield the irradiation light of the predetermined wavelength band; and
   at least two or more semi-transmission parts having each different light transmission on a transparent substrate,
   wherein the light transmission of each of the semi-transmission parts is determined by composition of material of the semi-transmission part or thickness of the semi-transmission part, and
   each of the semi-transmission parts is formed as a single layer.

2. The half tone mask of claim 1, wherein the light transmission of at least two or more semi-transmission parts is controlled according to the composition of the semi-transmission material or thickness of the semi-transmission part.

3. The half tone mask of claim 2, wherein the semi-transmission material comprises Cr, Si, Mo, Ta, Ti, and Al as a major element, and is complex material to which at least two or more of the major elements are mixed, or additive material to which at least one of COx, Ox, and Nx is added to the complex material.

4. The half tone mask of claim 1, wherein the light shielding part is formed by depositing the light-shielding material film, or by depositing sequentially a semi-transmission material film and a light-shielding material film.

5. A manufacturing method of a half tone mask having a multi semi-transmission part, comprising:
   forming sequentially a light shielding layer and a first photoresist on a transparent substrate and forming a light transmission part for transmitting light and a light shielding part for shielding the light on the light shielding layer by using an exposure process, a development process and an etching process sequentially;
   depositing semi-transmission materials for transmitting only a part of the light with a predetermined wavelength band irradiated on the light shielding part and the light transmission part after removing the first photoresist;
   forming a second photoresist on the semi-transmission material and exposing and developing the second photoresist to expose a part of the semi-transmission material;
   forming a basic semi-transmission part by removing the second photoresist after etching the exposed semi-transmission material;
   depositing the semi-transmission materials on the light transmission part on which the basic semi-transmission part is not formed and forming at least one additional semi-transmission part with light transmission different from the basic semi-transmission part;
   forming each different semi-transmission material on the transparent substrate; and
   at least two or more semi-transmission parts having each different light transmission,
   wherein each of the semi-transmission parts is formed as a single layer.

6. The method of claim 5, wherein forming the semi-transmission part comprises:
   forming a third photoresist on the basic semi-transmission part, the light transmission part and the light shielding part, and exposing and developing the third photoresist to expose a part of the light transmission part, where the semi-transmission part is formed, to the outside;
   depositing the semi-transmission material on the upper part of the light transmission part exposed to the outside and the upper part of the second photoresist; and
   removing the third photoresist and the semi-transmission material deposited on the upper part of the third photoresist by using the lift-off method and leaving the semi-transmission material only on the upper part of the light transmission part exposed to the outside.

7. A manufacturing method of a half tone mask having a multi semi-transmission part, comprising:
   forming sequentially a light shielding layer and a first photoresist on a transparent substrate and forming a light transmission part for transmitting light and a light shielding part for shielding the light on the light shielding layer by using an exposure process, a development process and an etching process sequentially;
   after removing the first photoresist and forming a second photoresist on the light transmission part and the light shielding part, exposing and developing the second photoresist to expose a part of the light transmission part, where the semi-transmission part is formed, to the outside;
   depositing the semi-transmission material on an upper part of the light transmission part exposed to the outside and an upper part of the second photoresist;
   forming a basic semi-transmission part by removing the second photoresist and the semi-transmission material deposited on the upper part of the second photoresist by using a lift-off method and remaining the semi-transmission material only on the upper part of the light transmission part exposed to the outside;
   depositing the semi-transmission materials on the light transmission part on which the basic semi-transmission part is not formed and forming at least one additional semi-transmission part with light transmission different from the basic semi-transmission part;
   forming each different semi-transmission material on the transparent substrate; and
   at least two or more semi-transmission parts having each different light transmission,
   wherein each of the semi-transmission parts is formed as a single layer.

8. The method of claim 7, wherein forming the semi-transmission part comprises:
   forming a third photoresist on the basic semi-transmission part, the light transmission part and the light shielding part, and exposing and developing the third photoresist to expose a part of the light transmission part, where the semi-transmission part is formed, to the outside;

depositing the semi-transmission material on the upper part of the light transmission part exposed to the outside and the upper part of the second photoresist; and removing the third photoresist and the semi-transmission material deposited on the upper part of the third photoresist by using the lift-off method and leaving the semi-transmission material only on the upper part of the light transmission part exposed to the outside.

9. A manufacturing method of a half tone mask having a multi semi-transmission part, comprising:

forming a full exposure region and a half exposure region by forming sequentially a semi-transmission material film, a light shielding material film, and a first photoresist, on a transparent substrate, performing a full exposure process and a half exposure process on the first photoresist, and developing the exposed part of the first photoresist;

etching sequentially the light shielding material film and the semi-transmission material film, all of which are respectively exposed on the full exposure region, so as to form a light transmission part;

performing an ashing process on the first photoresist to expose the light shielding material film located on the half exposure region to the outside;

forming a basic semi-transmission part by etching partially the light shielding material film exposed to the outside to expose the semi-transmission material film to the outside and forming a light shielding part by removing the first photoresist;

forming at least one additional semi-transmission part with light transmission different from the basic semi-transmission part by depositing the semi-transmission material on the light transmission part;

forming each different semi-transmission material on the transparent substrate; and at least two or more semi-transmission parts having each different light transmission, wherein the basic semi-transmission part and the additional semi-transmission part are formed as a single layer.

10. The method of claim 9, wherein forming the semi-transmission part comprises:

forming a second photoresist on the basic semi-transmission part, the light transmission part and the light shielding part, and exposing and developing the third photoresist to expose a part of the light transmission part, where the semi-transmission part is formed, to the outside;

depositing the semi-transmission material on the upper part of the light transmission part exposed to the outside and the upper part of the second photoresist; and removing the second photoresist and the semi-transmission material deposited on the upper part of the second photoresist by using the lift-off method and remaining the semi-transmission material only on the upper part of the light transmission part exposed to the outside.

11. The method of claim 10, wherein forming the additional semi-transmission part is repeated to form additionally the additional semi-transmission part.

12. The method of claim 9, wherein forming the additional semi-transmission part is repeated to form additionally the additional semi-transmission part.

13. A half tone mask having a multi semi-transmission part, comprising:

a transparent substrate;

a light transmission part formed on the transparent substrate to transmit irradiation light of a predetermined wavelength band;

a light shielding part formed on the transparent substrate to shield the irradiation light of the predetermined wavelength band; and at least two or more semi-transmission parts passing through the light of the predetermined wavelength irradiated on the transparent substrate with each different light transmission, wherein the semi-transmission part comprises the combination of a slit type semi-transmission part and a deposition type semi-transmission part; the deposition type semi-transmission part deposits is formed by depositing a semi-transmission material film with a single layer; and the slit type semi-transmission part comprises many slits on the light shielding part or the deposition type semi-transmission part.

14. The half tone mask of claim 13, wherein the light transmission of the deposition type semi-transmission part is changed according to the composition or thickness of the semi-transmission material film.

15. The half tone mask of claim 14, wherein the semi-transmission material comprises Cr, Si, Mo, Ta, Ti, Al as major elements, and is mixed complex of at least two or more of major elements consisting of Cr, Si, Mo, Ta, Ti, Al or an additive of at least one elements selected from Cox, Ox and Nx.

16. The half tone mask of claim 13, wherein the light transmission of the slit type semi-transmission part is changed according to width and height of the slit.

17. A manufacturing method of a half tone mask having a multi semi-transmission part, comprising:

forming sequentially a light shielding material film, and a first photoresist, on a transparent substrate, and then forming at least one slit space part on the first photoresist using an exposure process and a development process;

etching the exposed light shielding material film using the development process and removing the first photoresist so as to form a light shielding part, a light transmission part and a slit type semi-transmission part; and depositing the semi-transmission material on the light transmission part with a single layer to form at least one deposition type semi-transmission parts having light transmission different from the slit type semi-transmission part.

18. A manufacturing method of a half tone mask having a multi semi-transmission part, comprising:

forming sequentially a light shielding material film and a first photoresist on a transparent substrate and forming a light transmission part for transmitting light and a light shielding part for shielding the light on the light shielding layer by using an exposure process, a development process and an etching process sequentially;

depositing semi-transmission materials for transmitting a part of the light with a predetermined wavelength band on the light transmission part with a single layer to form at least one deposition type semi-transmission part; and forming a slit type semi-transmission part having light transmission different from the deposition type semi-transmission on at least one of the deposition type semi-transmission part and the light shielding part by forming many slits.

* * * * *